(12) United States Patent
Kuisma

(10) Patent No.: US 7,982,291 B2
(45) Date of Patent: Jul. 19, 2011

(54) METHOD FOR MANUFACTURING A MICROELECTROMECHANICAL COMPONENT, AND A MICROELECTROMECHANICAL COMPONENT

(75) Inventor: Heikki Kuisma, Helsinki (FI)

(73) Assignee: VTI Technologies Oy, Vantaa (FI)

( * ) Notice: Subject to any disclaimer, the term of this patent is extended or adjusted under 35 U.S.C. 154(b) by 840 days.

(21) Appl. No.: 11/430,035

(22) Filed: May 9, 2006

(65) Prior Publication Data

US 2007/0114623 A1 May 24, 2007

(30) Foreign Application Priority Data

Nov. 23, 2005 (FI) ..................................... 20055618

(51) Int. Cl.
*H01L 23/495* (2006.01)
(52) U.S. Cl. ............................ 257/676; 257/704; 438/51
(58) Field of Classification Search .................. 257/415, 257/417, 676, 704; 438/51
See application file for complete search history.

(56) References Cited

U.S. PATENT DOCUMENTS

| 6,214,644 | B1 | 4/2001 | Glenn |
| 6,512,300 | B2 | 1/2003 | Cheever et al. |
| 6,559,530 | B2 | 5/2003 | Hinzel et al. |
| 6,630,725 | B1 | 10/2003 | Kuo et al. |
| 6,936,918 | B2 | 8/2005 | Harney et al. |
| 7,009,302 | B2 | 3/2006 | Tao |
| 2003/0001251 | A1 | 1/2003 | Cheever et al. |
| 2003/0054584 | A1 | 3/2003 | Hinzel et al. |
| 2005/0054133 | A1 | 3/2005 | Felton et al. |

FOREIGN PATENT DOCUMENTS

| EP | 1 433 742 A2 | 6/2004 |
| WO | WO 2004/006382 A1 | 1/2004 |
| WO | WO 2004/037711 A2 | 5/2004 |
| WO | WO 2005/000733 A2 | 1/2005 |

OTHER PUBLICATIONS

International Search Report PCT/FI2006/050508 filed Nov. 21, 2006.
US Office Action, U.S. Appl. No. 12/292,435, Date: Feb. 15, 2011, pp. 1-14.

*Primary Examiner* — Thien F Tran
(74) *Attorney, Agent, or Firm* — Squire, Sanders & Dempsey (US) LLP

(57) ABSTRACT

The invention relates to microelectromechanical components, like microelectromechanical gauges used in measuring e.g. acceleration, angular acceleration, angular velocity, or other physical quantities. The microelectromechanical component, according to the invention, comprises a microelectromechanical chip part, sealed by means of a cover part, and an electronic circuit part, suitably bonded to each other. The aim of the invention is to provide an improved method of manufacturing a microelectromechanical component, and to provide a microelectromechanical component, which is applicable for use particularly in small microelectromechanical sensor solutions.

101 Claims, 23 Drawing Sheets

METHOD FOR MANUFACTURING A MICROELECTROMECHANICAL COMPONENT, AND A MICROELECTROMECHANICAL COMPONENT

FIELD OF THE INVENTION

The present invention relates to microelectromechanical components, such as microelectromechanical gauges used in the measuring of, for example, acceleration, angular acceleration, angular velocity, or other physical quantities, microelectromechanical resonators and filters used for stabilizing the frequency of oscillation or filtering electrical signals, and other microelectromechanical devices, where a combination of encapsulated microelectromechanical parts and microcircuits is desired. The object of the present invention is to provide an improved method of manufacturing a microelectromechanical component, and a microelectromechanical component applicable for use particularly in small microelectromechanical sensor solutions, in solutions for stabilizing frequency of oscillation, or in solutions for filtering electrical signals.

BACKGROUND OF THE INVENTION

The use of microelectromechanical components (MEMS, Microelectromechanical Systems) in, for example, the sensor technique for measuring various physical quantities like acceleration, angular velocity, or pressure, has proved to be a reliable method of simple principle. In a microelectromechanical sensor, the measuring is based on, for example, the capacitive principle, wherein a change in the motional state of the sensor causes a displacement of a spring suspended seismic mass. The position of the mass can be detected by means of the capacitance between a pair of electrodes, the capacitance between the surfaces being dependent of their surface area and the distance between the surfaces. Measuring based on a microelectromechanical sensor can be used even at rather small metering ranges of various physical quantities.

In devices for data communications and data processing, integration of most of the functions has been accomplished into one or, at most, a few silicon chips. Due to their technological incompatibility, integration of functions responsible for synchronization of data processing, stabilization of radio frequencies, filtering an electrical signal, matching of electric impedances, and switching electrical signals, however, has not always been possible. In MEMS resonators and MEMS filters based on silicon technology, a silicon component, by means of electrostatic forces, for example, is set in mechanical oscillatory motion, and the shape and dimensions of the silicon component is given to control the impedance due to the electro-acoustic coupling between the connectors, or the propagation of a signal between the connectors. In a MEMS switch, the signal path is opened or closed by means of movable components manufactured with the MEMS technique, said components being controlled e.g. by electrostatic forces. For an impedance matching device, tiny passive components, such as coils or capacitors, are manufactured by with MEMS techniques. The capacitors can be adjustable, air isolated MEMS structures.

Traditionally, integrated circuits are sealed by means of a technique, whereby they are installed e.g. onto a metal leadframe. At connection points of the circuits, connecting wires are bonded, the other ends of which are connected to bonding areas of the leadframe. Then the leadframe and the circuit are cast in plastic and finally the external connection areas or connection wires, by means of which the component will be connected to a circuit board, are formed by cutting, bending, or some other such method.

In the manufacturing of electronic components, a novel encapsulation method for silicon chips and similar electronic components is wafer-level packaging (WLP), wherein all encapsulation phases are performed on the surface of the silicon wafer prior to dicing. Hereby, significant savings in size and cost are achieved. Examples of such prior art methods would be the Ultra CSP-technique by Amkor Corporation (CSP, Chip Scale Packaging), in which thick layers of polymer are spread onto the surface of a silicon wafer, copper leads are deposited and soldering bumps, whereby the chip directly can be connected onto a circuit board, are installed or deposited.

The microelectromechanical components differ from electronic components, such as integrated circuits, in that, instead of passivation by means of a solid material, e.g. nitride passivation, the component requires mechanical protection, a cover, under which an open space remains, in which the electromechanical structures can move. Applying wafer-level packaging to microelectromechanical components is particularly tempting, since they are characterized by large size and, in particular, large thickness, and thus, encapsulated in a traditional manner they would be larger and, in particular, thicker than microcircuits encapsulated in a corresponding manner. On the other hand, the encapsulation of microelectromechanical components is problematic, due to the necessary cover.

The microelectromechanical components must be hermetically sealed, such that the moving parts remain in a chamber closed from the surroundings. The sealing can be made by bonding the microelectromechanical wafer to another wafer, a so called cover wafer. The utilization of cover wafers with microelectromechanical components is well known.

Another essential problem in microelectromechanical sensor components is the integration of electrical functions in association with the microelectromechanical component. This can be accomplished in a known manner by means of capsule level integration, having an external capsule comprising dielectric and conductive parts. In capsule level integration, the conductive wire connections between the parts integrate the parts into a unit.

Below, prior art is described with exemplifying reference to the accompanying drawings, of which:

FIG. 1 shows a method according to prior art for the manufacturing of a microelectromechanical component by means of monolithic integration, FIG. 2 shows a method according to prior art for the manufacturing of a microelectromechanical component by means of integration implemented in a plastic cast capsule.

FIG. 3 shows a method according to prior art for the manufacturing of a microelectromechanical component by means of integration implemented by stacking in a plastic cast capsule.

FIG. 1 shows a method according to prior art for the manufacturing of a microelectromechanical component by means of monolithic integration. In the method according to prior art for the manufacturing of a microelectromechanical component by means of monolithic integration, a microelectromechanical chip part 1 and an electronic circuit part 2 are manufactured on the same silicon wafer 3, and the electric connection between them is created by means of thin films of metal. The microelectromechanical chip part 1 and the electronic circuit part 2 are protected by means of a common cover part 4, they are connected by means of a wire connection 5, and are further cast in a plastic cast capsule 6. The prior art microelectromechanical component also comprises a metal leadframe 7.

FIG. 2 shows a method according to prior art for the manufacturing of a microelectromechanical component by means of integration implemented in a plastic cast capsule. In the method according to prior art for the manufacturing of a microelectromechanical component by means of integration in a plastic cast capsule, a microelectromechanical chip part 8 and an electronic circuit part 9 are separately manufactured onto the same silicon wafer element 10. The microelectromechanical chip part 8 is protected by means of a separate cover part 11. The electric connection between the microelectromechanical chip part 8 and the electronic circuit part 9 is implemented by means of a wire connection 12. The electronic circuit part 9 is connected by means of a wire connection 13. Subsequently, the entity composed of the microelectromechanical chip part 8 and the electronic circuit part 9 is cast in a plastic cast capsule 14. The prior art microelectromechanical component also comprises a metal leadframe 15.

FIG. 3 shows a method according to prior art for the manufacturing of a microelectromechanical component by means of integration implemented by stacking in a plastic cast capsule. In the method according to prior art for the manufacturing of a microelectromechanical component by means of integration by stacking in a plastic cast capsule, a microelectromechanical chip part 16 is manufactured onto a silicon wafer 17. The microelectromechanical chip part 16 is protected by means of separate cover part 18. An electronic circuit part 19 is manufactured on top of the cover part. The electric connection between the microelectromechanical chip part 16 and the electronic circuit part 19 is implemented by means of a wire connection 20. The microelectromechanical chip part 16 is connected by means of a wire connection 21. Then the entity composed of the microelectromechanical chip part 16 and the electronic circuit part 19 is cast in a plastic cast capsule 22. The prior art microelectromechanical component also comprises a metal leadframe 23.

A central problem in the solutions according to prior art for integrating the electrical functions of microelectromechanical components with the microelectromechanical component is the large size caused by the cover wafer and the two parts, the microelectromechanical chip part and the electronic circuit part. The size of the solution becomes large, when the components are cast in the kind of plastic capsule typically used in the field.

Additionally, a problem in the solutions according to prior art for integrating the electrical functions of microelectromechanical components with the microelectromechanical component is also the wasting of circuit solution surface area for bonding areas.

Thus, in the manufacturing of professional and consumer electronics, there is a clearly increasing requirement for small microelectromechanical components, in which integration of the electrical functions with the microelectromechanical component has been solved, and which are suitable for use particularly in small microelectromechanical sensor solutions, oscillation frequency stabilization solutions, electrical signal filtering solutions, electrical signal switching solutions and electric impedance matching solutions.

SUMMARY OF THE INVENTION

The object of the invention is an improved method for the manufacturing of a microelectromechanical component, and an improved microelectromechanical component. By means of this invention a microelectromechanical component solution is achieved, wherein electrical functions are integrated with the microelectromechanical component in a preferable manner, and which also is applicable for use, in particular, in small micromechanical motion sensor solutions, pressure sensor solutions, oscillation frequency stabilization solutions, electrical signal filtering solutions, electrical signal switching solutions, and electric impedance matching solutions.

The invention relates to microelectromechanical components like, for example, microelectromechanical gauges used in measuring e.g. acceleration, angular acceleration, angular velocity, pressure, or other physical quantities, or microelectromechanical devices used for stabilization of frequency of oscillation, electrical signal filtering, electrical signal switching, or electric impedance matching. An object of the invention is also to provide an improved method of manufacturing a microelectromechanical component, and a microelectromechanical component applicable for use, in particular, in small microelectromechanical sensor solutions, oscillation frequency stabilization solutions, electrical signal filtering solutions, electrical signal switching solutions, and electric impedance matching solutions.

According to a first characteristic of the invention, a method is provided for manufacturing a microelectromechanical component, in which method a microelectromechanical chip part is sealed by means of a cover part, which cover part is provided with lead-in structures for bringing electric connections through the cover part, such that, in the method, a first part is one of the following, and a second part is another one than the first part and one of the following:
    said microelectromechanical chip part sealed by means of the cover part, or
    an electronic circuit part,
such that
    the first part is bonded to the second part by means of first bonding members, and that
    the second part is larger than the first part, and that, close to the first part, second bonding members are manufactured onto the surface of the second part, for external connections of the microelectromechanical component.

Preferably, the cover part is mainly made of glass, such that, in the cover part, conductive areas extending through the glass element are manufactured out of silicon. Alternatively, the cover part is mainly made of silicon, and glass insulation is manufactured onto the cover part, such that conductive areas extending through the glass insulation are manufactured out of silicon. Further, alternatively, the cover part is mainly made of silicon, and into said cover part, glass insulators are manufactured, such that the cover part is divided into strip-like conductive areas. Further, alternatively, the cover part is mainly made of silicon, and into said cover part, glass insulation is manufactured, such that the cover part is divided into insular conductive areas. Further, alternatively, the cover part and/or the glass insulators are manufactured out of some other known dielectric material instead of glass. Further, alternatively, the cover part and/or the conductive areas are manufactured out of some other known conductive material instead of silicon.

Preferably, the formation of an electric connection between the conducting lead-in of the cover part and the microelectromechanical chip part is implemented by means of a direct bond. Alternatively, the formation of an electric connection between the conducting lead-in of the cover part and the microelectromechanical chip part is implemented by means of metal layers located on the surface. Further, alternatively, the formation of an electric connection between the conducting lead-in of the cover part and the microelectromechanical chip part is implemented by means of a soldering bump.

Preferably, prior to attaching the cover part to the microelectromechanical chip part, a redistribution layer is manufactured onto the surface of the cover part. Alternatively, after attaching the cover part to the microelectromechanical chip part, a redistribution layer is manufactured onto the surface of the cover part.

Preferably, by means of the redistribution layer, a conductive connection is created between the conductive areas of the cover part and the first bonding members. Alternatively, by means of the redistribution layer, a conductive connection is created between the first bonding members and the second bonding members. Preferably, prior to manufacturing the redistribution layer, a dielectric layer is manufactured onto the surface of the cover part. Preferably, a protective layer is manufactured on top of the redistribution layer.

Preferably, the first bonding members are manufactured onto the surface of the circuit part. Alternatively, the first bonding members are manufactured onto the redistribution layer of the cover part into openings in the protective layer. Further, preferably, the electronic circuit part is connected to the surface of the cover part protecting the microelectromechanical chip part by means of a flip-flop bonding method.

Preferably, the electronic circuit part is smaller than the microelectromechanical chip part. Preferably, the narrow gap between the electronic circuit part and the cover part of the microelectromechanical chip part is filled with an underfill. Preferably, the second bonding members of the microelectromechanical component are implemented by means of wire connections. Further, preferably, a plastic cast capsule is cast over the microelectromechanical component.

Preferably, the second bonding members of the microelectromechanical component are implemented by means of bump connectors. Further, preferably, the height of the bump connectors is at least equal to the total height of the electronic circuit part and the first bonding members.

Preferably, the bump connectors are deposited prior to the flip-flop bonding. Alternatively, the bump connectors are deposited interleaved with the manufacturing of the flip-flop bond. Preferably, the microelectromechanical component is connected to the surface of a circuit board by the flip-flop bonding method, such that the bonding bumps will line up with connection areas of the circuit board.

Preferably, the second bonding members of the microelectromechanical component are implemented by means of adhesive joints. Alternatively, the second bonding members of the microelectromechanical component are implemented by means of direct soldering joints. Further, preferably, the second bonding members form a conductive connection to the capsule structure of the microelectromechanical component, which capsule structure is provided with conductive coatings. Preferably, the capsule structure of the microelectromechanical component is suitably designed to match the microelectromechanical component.

Preferably, the first bonding members are manufactured onto the surface of the electronic circuit part. Alternatively, the first bonding members are manufactured on top of the redistribution layer of the cover part protecting the microelectromechanical chip part, into openings in the protective layer. Further, preferably, the microelectromechanical chip part is connected to the surface of the electronic circuit part by means of the flip-flop bonding method, the cover part facing the surface of electronic circuit part.

Preferably, the microelectromechanical chip part is smaller than the electronic circuit part. Preferably, the narrow gap between the electronic circuit part and the cover part of the microelectromechanical chip part is filled with an underfill. Preferably, the second bonding members of the microelectromechanical component are implemented by means of wire connections. Further, preferably, a plastic cast capsule is cast over the microelectromechanical component.

Preferably, the second bonding members of the microelectromechanical component are implemented by means of bump connectors. Further, preferably, the height of the bump connectors is at least equal to the total height of the microelectromechanical chip part and the first bonding member.

Preferably, the bump connectors are manufactured prior to the flip-flop bonding. Alternatively, the bump connectors are manufactured interleaved with the manufacturing of the flip-flop bond. Preferably, the microelectromechanical component is attached to the surface of a circuit board by means of the flip-flop bonding method, such that the bonding bumps line up with connection areas of the board.

Preferably, the second bonding members of the microelectromechanical component are implemented by means of adhesive joints. Alternatively, the second bonding members of the microelectromechanical component are implemented by means of direct soldering joints. Further, preferably, the second bonding members form a conductive connection to the capsule structure of the microelectromechanical component, said capsule structure being provided with conductive coatings. Preferably, the capsule structure of the microelectromechanical component is suitably designed to match the microelectromechanical component.

Preferably, the electronic circuit part of the microelectromechanical component possesses electrical signal processing capability. Preferably, a plate-like substrate comprising a set of second parts serves as a base for installing a first part. Further, preferably, a set of first parts are installed, one by one, onto the surface of the plate-like substrate comprising a set of second parts. Further, preferably, only such first parts, that have passed testing, are installed onto the surface of such second parts, which have passed testing. Preferably, the plate-like substrate comprising a second part is only diced after the installation phases. Preferably, the plate-like substrate comprising a second part is only diced after final testing.

According to a second characteristic of the invention, a microelectromechanical component is provided, comprising:
  a microelectromechanical chip part sealed by means of a cover part, which cover part is provided with lead-in structures for bringing electric connections through the cover part, and
  an electronic circuit part,
such that a first part is one of the following and a second part is another one than the first part and one of the following:
  said microelectromechanical chip part enclosed by the cover part, or
  said electronic circuit part,
such that
  the first part is connected to the second part by means of first bonding members,
  the second part is larger than the first part, and that second bonding members for external connections of the microelectromechanical component are manufactured close to the first part onto the surface of the second part.

Preferably, the cover part is made mainly of glass, such that in the cover part, conductive areas of silicon are manufactured extending through the glass element. Alternatively, the cover part is made mainly of silicon, and onto which cover part glass insulation is manufactured, such that, in the cover part, conductive areas are manufactured leading through the glass insulation. Further, preferably, the cover part is made mainly of silicon, and that, in the cover part, glass insulators are manufactured such, that the cover part is divided into strip-like conductive areas. Further, preferably, the cover part is made mainly of silicon, and, in the cover part, glass insulation is manufactured, such that the cover part is divided into insular conductive areas. Further, alternatively, the cover part and/or the glass insulators are manufactured out of some other known dielectric material instead of glass. Further, alternatively, the cover part and/or the conductive areas are manufactured out of some other known conducting material instead of silicon.

Preferably, the formation of an electric connection between the conducting lead-in of the cover part and the microelectromechanical chip part is implemented by means of a direct bond. Alternatively, the formation of an electric connection between the conducting lead-in of the cover part and the microelectromechanical chip part is implemented by means of metal layers located on the surface. Further, alternatively, the formation of an electric connection between the conducting lead-in of the cover part and the microelectromechanical chip part is implemented by means of a soldering bump.

Preferably, a redistribution layer is manufactured onto the surface of the cover part. Further, preferably, by means of the redistribution layer, a conductive connection is created between the conductive areas of the cover part and the first bonding members. Alternatively, by means of the redistribution layer, a conductive connection is created between the first bonding members and the second bonding members. Preferably, prior to manufacturing the redistribution layer, a dielectric layer is manufactured onto the surface of the cover part. Preferably, a protective layer is manufactured on top of the redistribution layer.

Preferably, the first bonding members are manufactured onto the surface of the circuit part. Alternatively, the first bonding members are manufactured onto the redistribution layer of the cover part, into openings in the protective layer. Further, preferably, the electronic circuit part is bonded to the surface of the cover part protecting the microelectromechanical chip part.

Preferably, the electronic circuit part is smaller than the microelectromechanical chip part. Preferably, the narrow gap between the electronic circuit part and the microelectromechanical chip part is filled with an underfill. Preferably, the second bonding members of the microelectromechanical component are implemented by means of wire connections. Further, preferably, a plastic cast capsule is cast over the microelectromechanical component.

Preferably, the second bonding members of the microelectromechanical component are implemented by means of bump connectors. Further, preferably, the height of the bump connectors is at least equal to the total height of the electronic circuit part and the first bonding member. Preferably, the microelectromechanical component is connected to the surface of a circuit board, such that the bonding bumps will line up with connection areas of the circuit board.

Preferably, the second bonding members of the microelectromechanical component are implemented by means of adhesive joints. Alternatively, the second bonding members of the microelectromechanical component are implemented by means of direct soldering joints. Further, preferably, the second bonding members form a conductive connection to the capsule structure of the microelectromechanical component, which capsule structure is provided with conductive coatings. Preferably, the capsule structure of the microelectromechanical component is suitably designed to match the microelectromechanical component.

Preferably, the first bonding members are manufactured onto the surface of the electronic circuit part. Alternatively, the first bonding members are manufactured on top of the redistribution layer of the cover part protecting the microelectromechanical chip part, into openings in the protective layer. Further, preferably, the microelectromechanical chip part is connected to the surface of the electronic circuit part the cover part facing the surface of electronic circuit part.

Preferably, the microelectromechanical chip part is smaller than the electronic circuit part. Preferably, the narrow gap between the electronic circuit part and the cover part of the microelectromechanical chip part is filled with an underfill. Preferably, the second bonding members of the microelectromechanical component are implemented by means of wire connections. Further, preferably, a plastic cast capsule is cast over the microelectromechanical component.

Preferably, the second bonding members of the microelectromechanical component are implemented by means of bump connectors. Further, preferably, the height of the bump connectors is at least equal to the total height of the microelectromechanical chip part and the first bonding member. Preferably, the microelectromechanical component is connected to the surface of the circuit board such, that the bonding bumps line up with connection areas on the circuit board.

Preferably, the second bonding members of the microelectromechanical component are implemented by means of adhesive joints. Further, preferably, the adhesive joints form a conductive connection to the capsule structure of the microelectromechanical component, which capsule structure is provided with conductive coatings. Preferably, the capsule structure of the microelectromechanical component is suitably designed to match the microelectromechanical component.

Preferably, the second bonding members of the microelectromechanical component are implemented by means of direct soldering joints. Preferably, the electronic circuit part of the microelectromechanical component possesses electrical signal processing capability.

According to a third characteristic of the invention, a microelectromechanical acceleration sensor is provided, comprising:
  a microelectromechanical chip part, which is sealed by means of a cover part, which cover part is provided with lead-in structures for bringing electric connections through the cover part, and
  an electronic circuit part,
such that a first part is one of the following, and a second part is another one than the first part and one of the following:
  said microelectromechanical chip part sealed by means of the cover part, or
  said electronic circuit part,
such that
  the first part is bonded to the second part by means of first bonding members,
  the second part is larger than the first part, and that, close to the first part, second bonding members are manufactured onto the surface of the second part for external connections of the microelectromechanical acceleration sensor.

According to a fourth characteristic of the invention, a microelectromechanical sensor of angular acceleration is provided, comprising:
  a microelectromechanical chip part, which is sealed by means of a cover part, which cover part is provided with lead-in structures for bringing electric connections through the cover part, and
  an electronic circuit part,
such that a first part is one of the following, and a second part is another one than the first part and one of the following:

said microelectromechanical chip part sealed by means of the cover part, or said electronic circuit part, such that the first part is bonded to the second part by means of first bonding members, the second part is larger than the first part, and that, close to the first part, second bonding members are manufactured onto the surface of the second part for external connections of the microelectromechanical sensor of angular acceleration.

According to a fifth characteristic of the invention, a microelectromechanical sensor of angular velocity is provided, comprising:

a microelectromechanical chip part, which is sealed by means of a cover part, which cover part is provided with lead-in structures for bringing electric connections through the cover part, and an electronic circuit part, such that a first part is one of the following, and a second part is another one than the first part and one of the following:

said microelectromechanical chip part sealed by means of the cover part, or said electronic circuit part, such that the first part is bonded to the second part by means of first bonding members, the second part is larger than the first part, and that, close to the first part, second bonding members are manufactured onto the surface of the second part for external connections of the microelectromechanical sensor of angular velocity.

According to a sixth characteristic of the invention, a microelectromechanical pressure sensor is provided, comprising:

a microelectromechanical chip part, which is sealed by means of a cover part, which cover part is provided with lead-in structures for bringing electric connections through the cover part, and an electronic circuit part, such that a first part is one of the following, and a second part is another one than the first part and one of the following:

said microelectromechanical chip part sealed by means of the cover part, or said electronic circuit part, such that the first part is bonded to the second part by means of first bonding members, the second part is larger than the first part, and that, close to the first part, second bonding members are manufactured onto the surface of the second part for external connections of the microelectromechanical pressure sensor.

According to a seventh characteristic of the invention, a microelectromechanical stabilizer of frequency of oscillation is provided, comprising:

a microelectromechanical chip part, which is sealed by means of a cover part, which cover part is provided with lead-in structures for bringing electric connections through the cover part, and an electronic circuit part, such that a first part is one of the following, and a second part is another one than the first part and one of the following:

said microelectromechanical chip part sealed by means of the cover part, or said electronic circuit part, such that the first part is bonded to the second part by means of first bonding members, the second part is larger than the first part, and that, close to the first part, second bonding members are manufactured onto the surface of the second part for external connections of the microelectromechanical stabilizer of frequency of oscillation.

According to an eighth characteristic of the invention, a microelectromechanical electrical signal filter is provided, comprising:

a microelectromechanical chip part, which is sealed by means of a cover part, which cover part is provided with lead-in structures for bringing electric connections through the cover part, and an electronic circuit part, such that a first part is one of the following, and a second part is another one than the first part and one of the following:

said microelectromechanical chip part sealed by means of the cover part, or said electronic circuit part, such that the first part is bonded to the second part by means of first bonding members, the second part is larger than the first part, and that, close to the first part, second bonding members are manufactured onto the surface of the second part for external connections of the microelectromechanical electrical signal filter.

According to a ninth characteristic of the invention, a microelectromechanical electrical signal switching component is provided, comprising:

a microelectromechanical chip part, which is sealed by means of a cover part, which cover part is provided with lead-in structures for bringing electric connections through the cover part, and an electronic circuit part, such that a first part is one of the following, and a second part is another one than the first part and one of the following:

said microelectromechanical chip part sealed by means of the cover part, or said electronic circuit part, such that the first part is bonded to the second part by means of first bonding members, the second part is larger than the first part, and that, close to the first part, second bonding members are manufactured onto the surface of the second part for external connections of the microelectromechanical electrical signal switching component.

According to a tenth characteristic of the invention, a microelectromechanical electric impedance matching device is provided, comprising:

a microelectromechanical chip part, which is sealed by means of a cover part, which cover part is provided with lead-in structures for bringing electric connections through the cover part, and an electronic circuit part, such that a first part is one of the following, and a second part is another one than the first part and one of the following:

said microelectromechanical chip part sealed by means of the cover part, or said electronic circuit part, such that the first part is bonded to the second part by means of first bonding members, the second part is larger than the first part, and that, close to the first part, second bonding members are manufactured onto the surface of the second part for external connections of the microelectromechanical electric impedance matching device.

BRIEF DESCRIPTION OF THE DRAWINGS

Below, the invention and its preferable embodiments are described in detail with exemplifying reference to the attached figures, of which.

Figure 1:
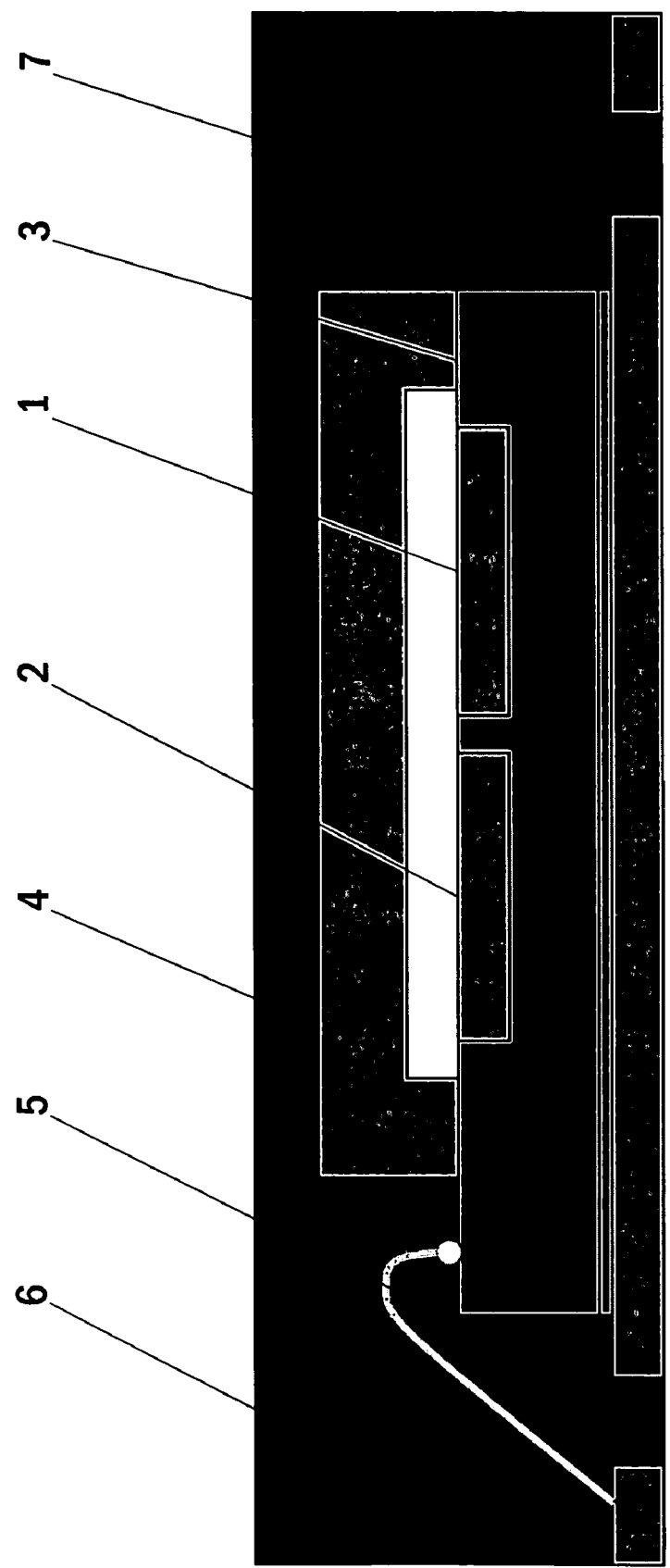
FIG. 1 shows a method, according to prior art, for manufacturing a microelectromechanical component by means of monolithic integration.
Figure 2:
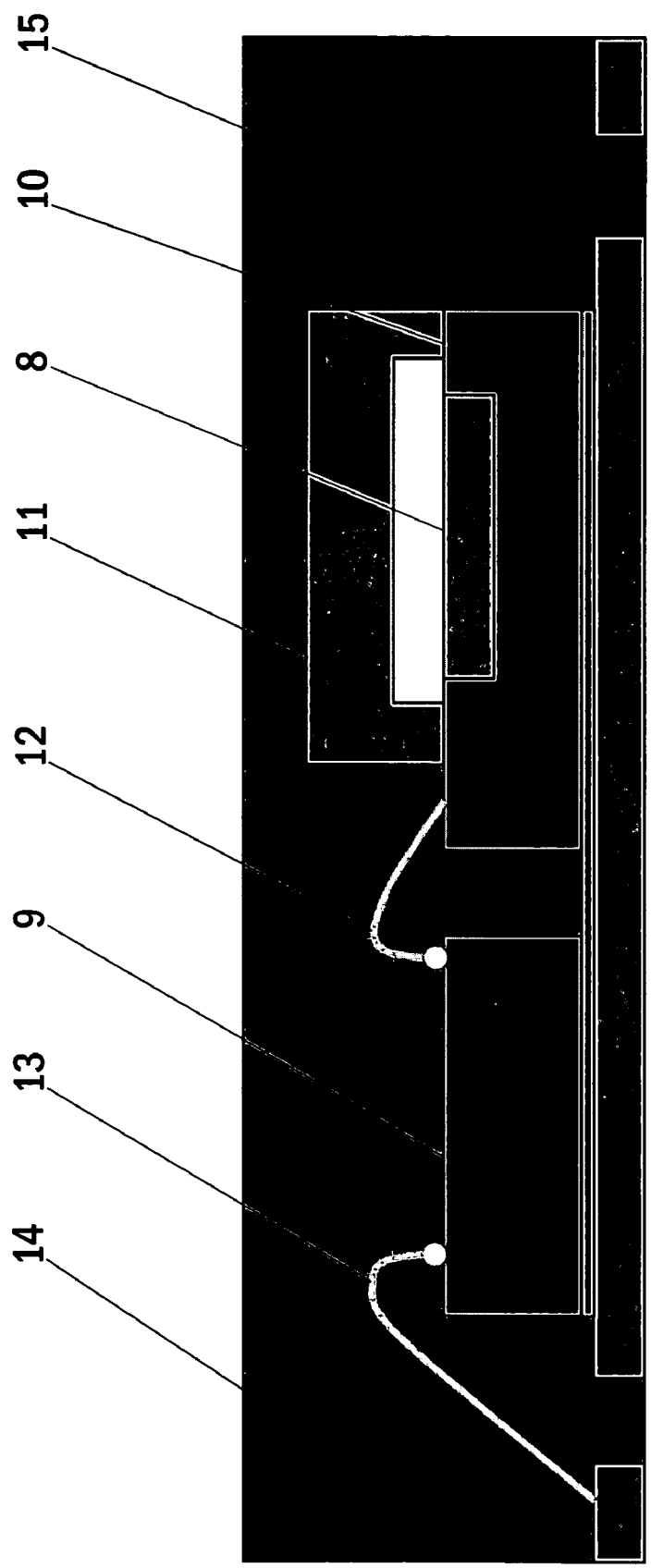
FIG. 2 shows a method, according to prior art, for manufacturing a microelectromechanical component by means of integration implemented in a plastic cast capsule.
Figure 3:
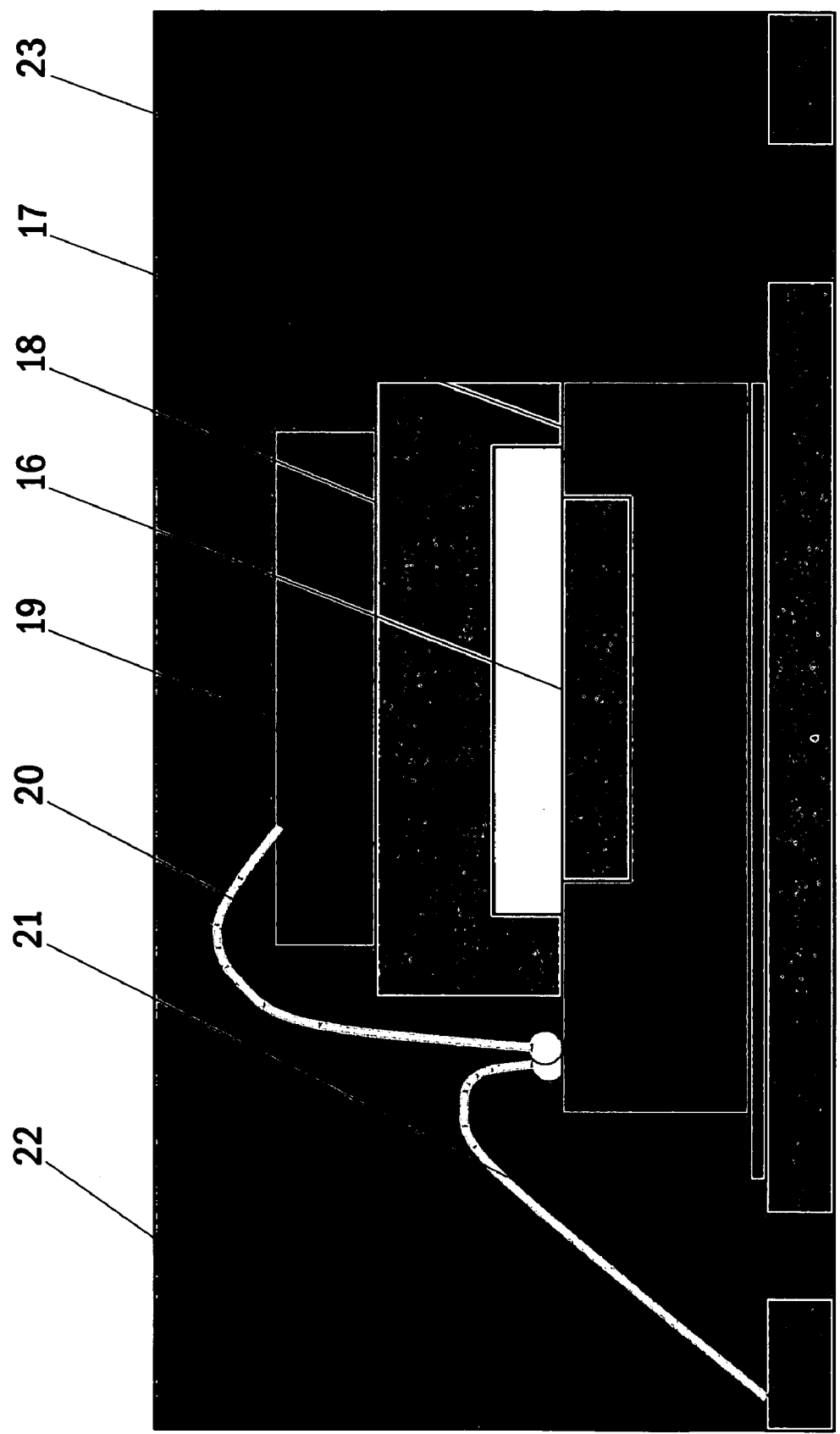
FIG. 3 shows a method, according to prior art, for manufacturing a microelectromechanical component by means of integration implemented by stacking in a plastic cast capsule.

The FIGS. 1-3 were presented above. Below, the invention and its preferable embodiments are described with reference to the FIGS. 4-25.

DETAILED DESCRIPTION OF THE INVENTION

Figure 4:
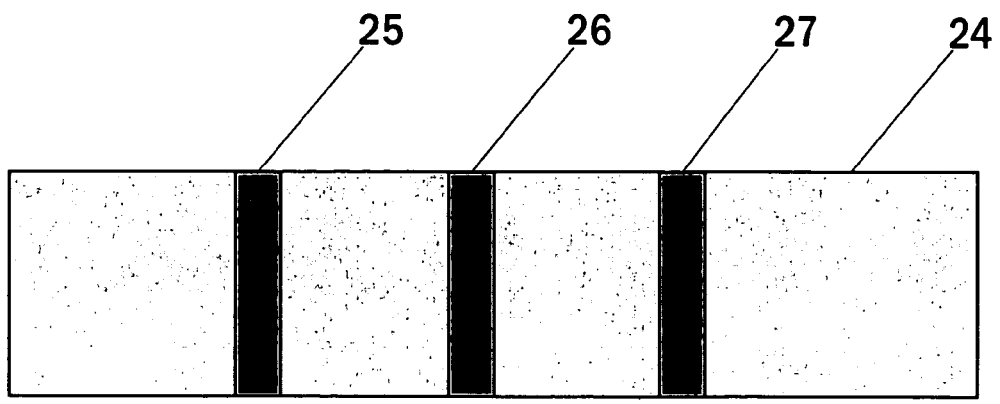
FIG. 4 shows a cover part of a microelectromechanical component solution, according to the invention, in a sectional and a projection view.
Figure 4:
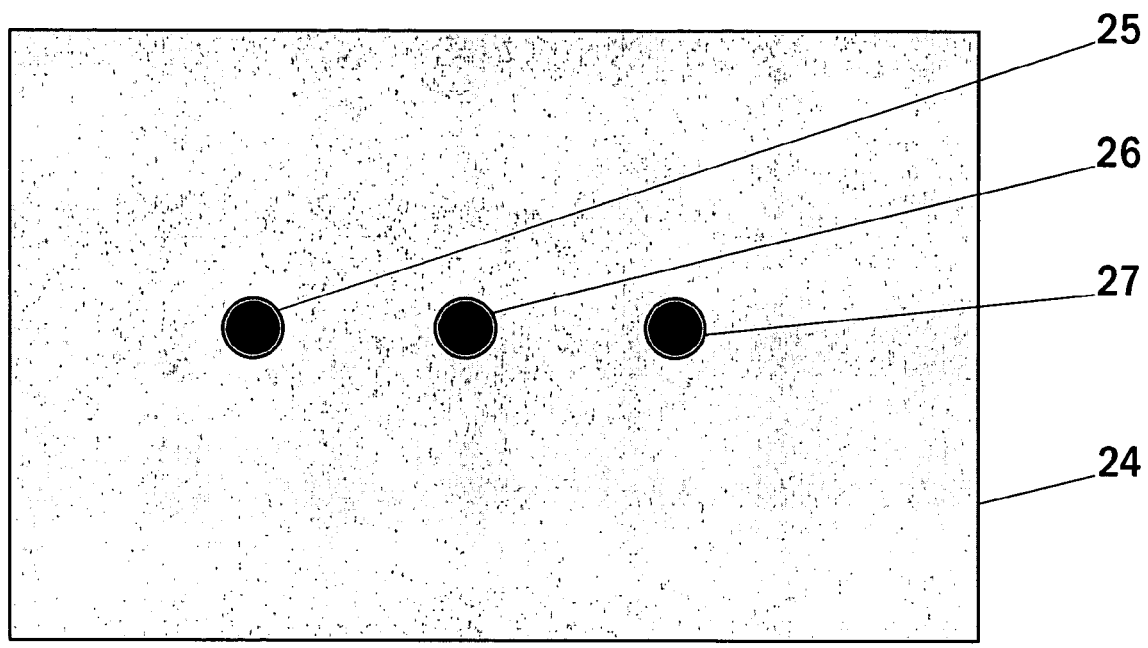

FIG. 4 shows a cover part of a microelectromechanical component solution, according to the invention, in a sectional and a projection view. The cover part of the microelectromechanical component solution, according to the invention, is indicated by the numeral 24, and it is typically mainly made of glass. The cover part 24 comprises conductive areas 25-27 extending through the glass element, which conductive areas 25-27 typically are made of silicon. The conductive areas 25-27 can be narrow and high.

Figure 5:
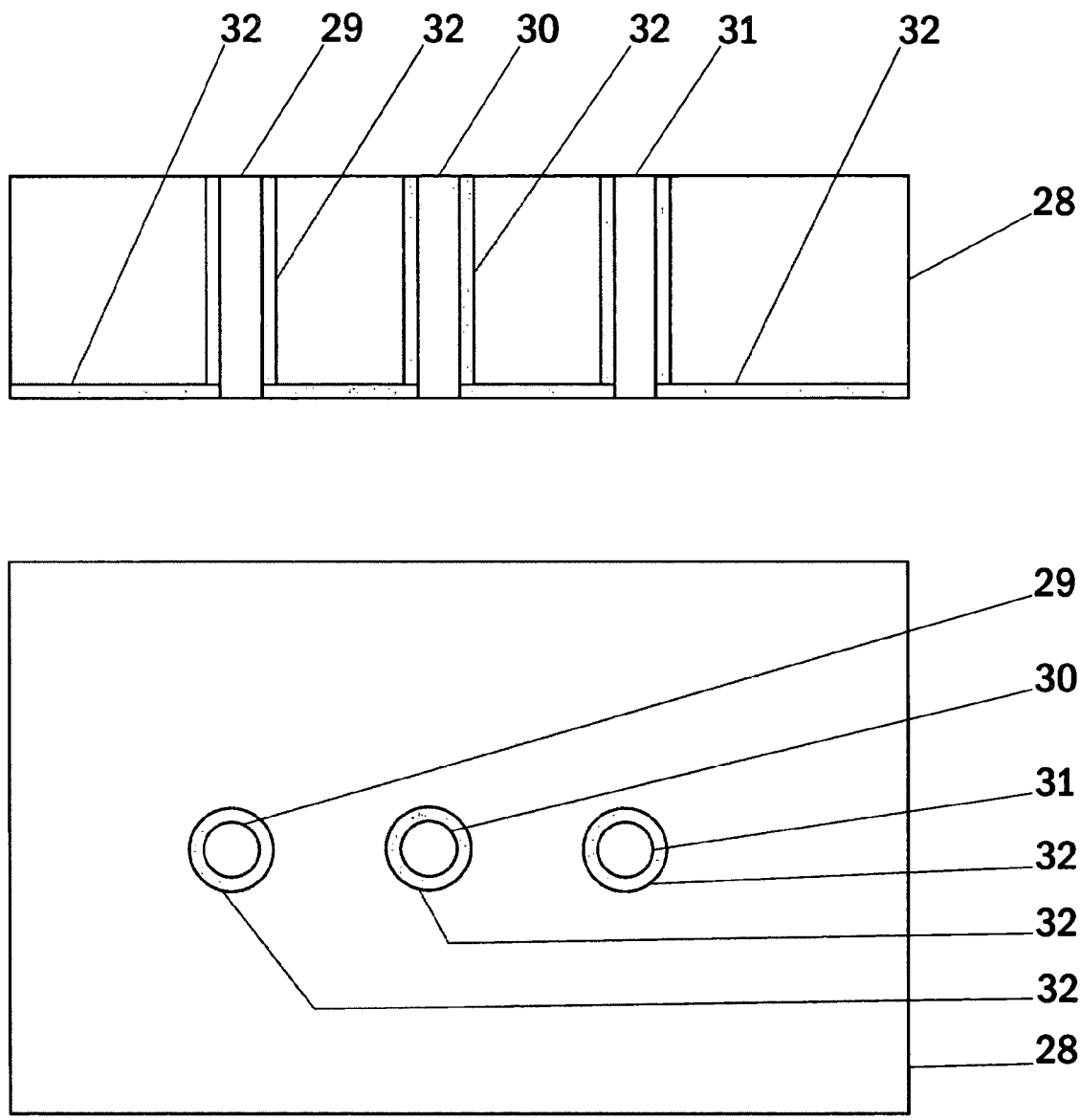
FIG. 5 shows an alternative cover part of a microelectromechanical component solution, according to the invention, in a sectional and a projection view.

FIG. 5 shows an alternative cover part of a microelectromechanical component solution, according to the invention, in a sectional and a projection view. The alternative cover part of the microelectromechanical component solution, according to the invention, is indicated by the numeral 28, and it is mainly made of silicon. The alternative cover part 28 comprises conductive areas 29-31 extending through the element, which conductive areas 29-31 typically are made of silicon. The conductive areas 29-31 of the alternative cover part 28 are isolated from the body of the cover part 28 by glass insulation 32, which glass insulation 32 also isolates the bottom of the cover part 28. The conductive areas 29-31 can be narrow and high.

Figure 6:
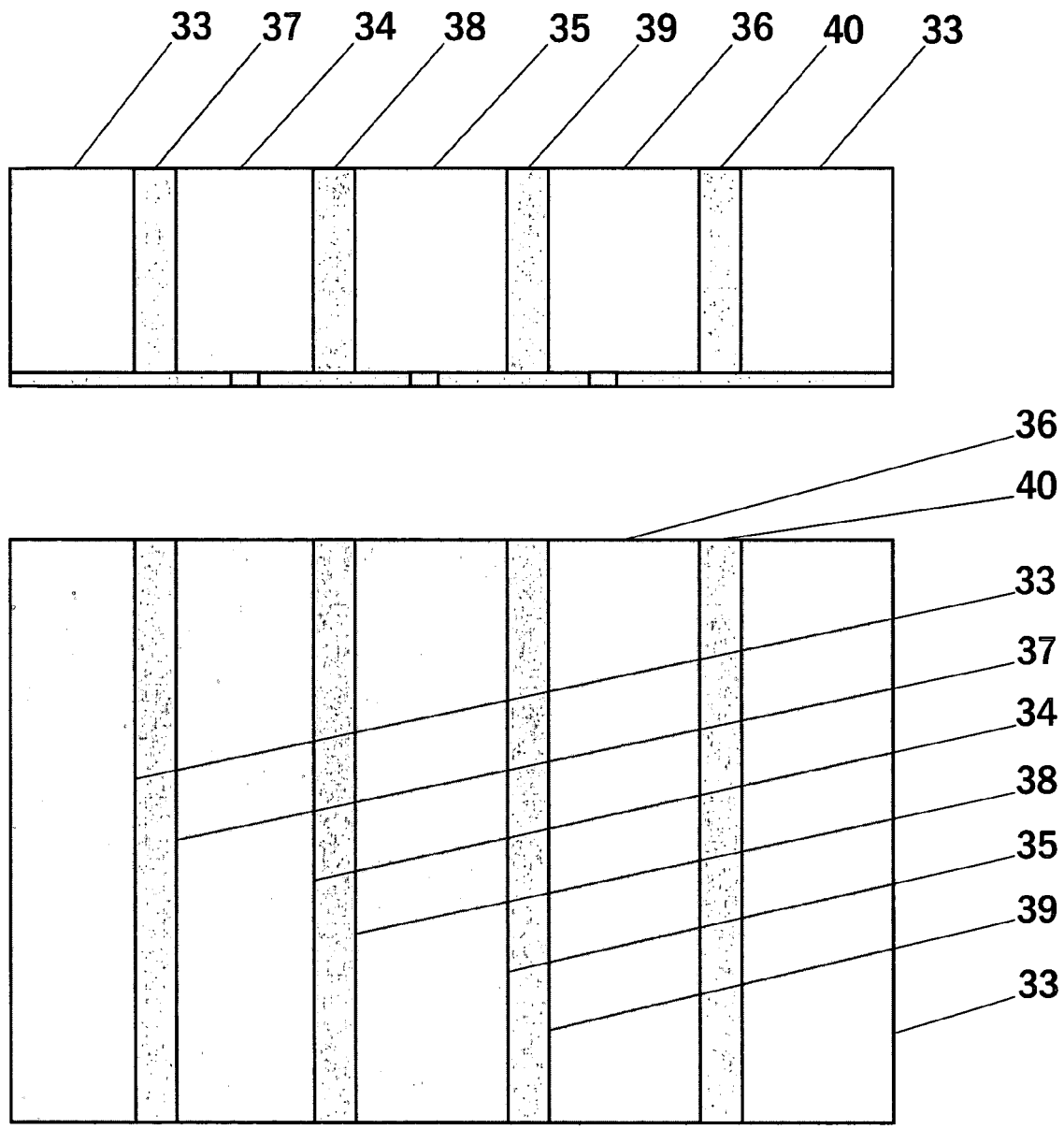
FIG. 6 shows a second alternative cover part of a microelectromechanical component solution, according to the invention, in a sectional and a projection view, FIG. 7 a third alternative cover part of a microelectromechanical component solution, according to the invention, in a sectional and a projection view.

FIG. 6 shows a second alternative cover part of a microelectromechanical component solution, according to the invention, in a sectional and a projection view. The second alternative cover part of the microelectromechanical component solution, according to the invention, is indicated by the numeral 33, and it is mainly made of silicon. The second alternative cover part 33 is divided into strip-like conductive areas 34-36 by means of narrow glass insulators 37-40. The conductive areas 34-36 are typically made of silicon. The glass insulators 37-40 of the second alternative cover part 33 also isolate the bottom of the cover part 33.

Figure 7:
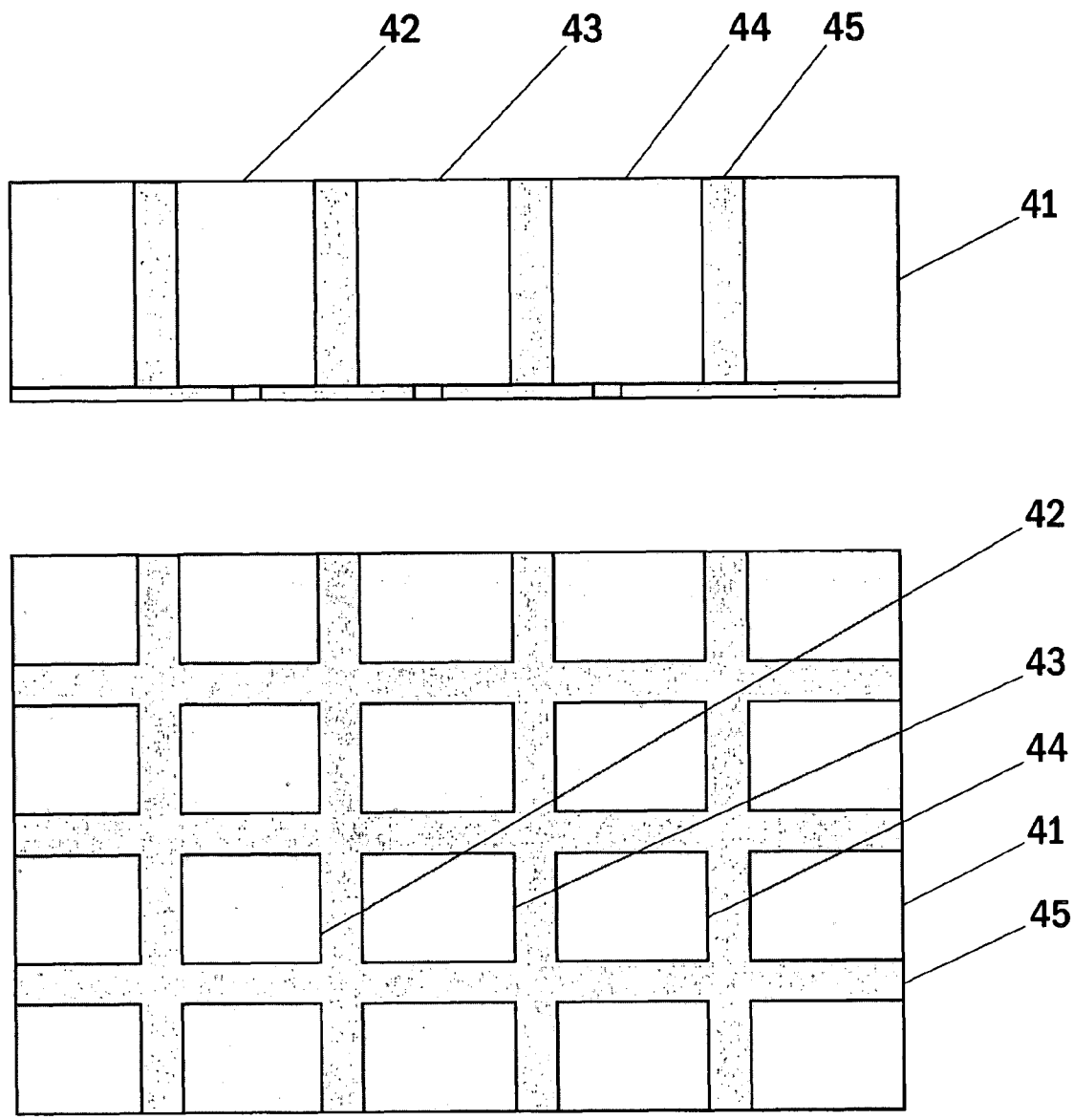

FIG. 7 shows a third alternative cover part of a microelectromechanical component solution, according to the invention, in a sectional and a projection view. The third alternative cover part of the microelectromechanical component solution, according to the invention, is indicated by the numeral 41, and it is mainly made of silicon. The third alternative cover part 41 is divided into insular conductive areas 42-44 by means of a narrow glass insulator 45. The conductive areas 42-44 typically are made of silicon. The glass insulation 45 of the third alternative cover part 41 also isolates the bottom of the cover part 41.

In the solution according to the invention, other kinds of cover parts can also be used, in which mutually isolated electric connections are formed through the cover part from one plane surface to the other, essentially perpendicularly through the cover part.

Figure 8:
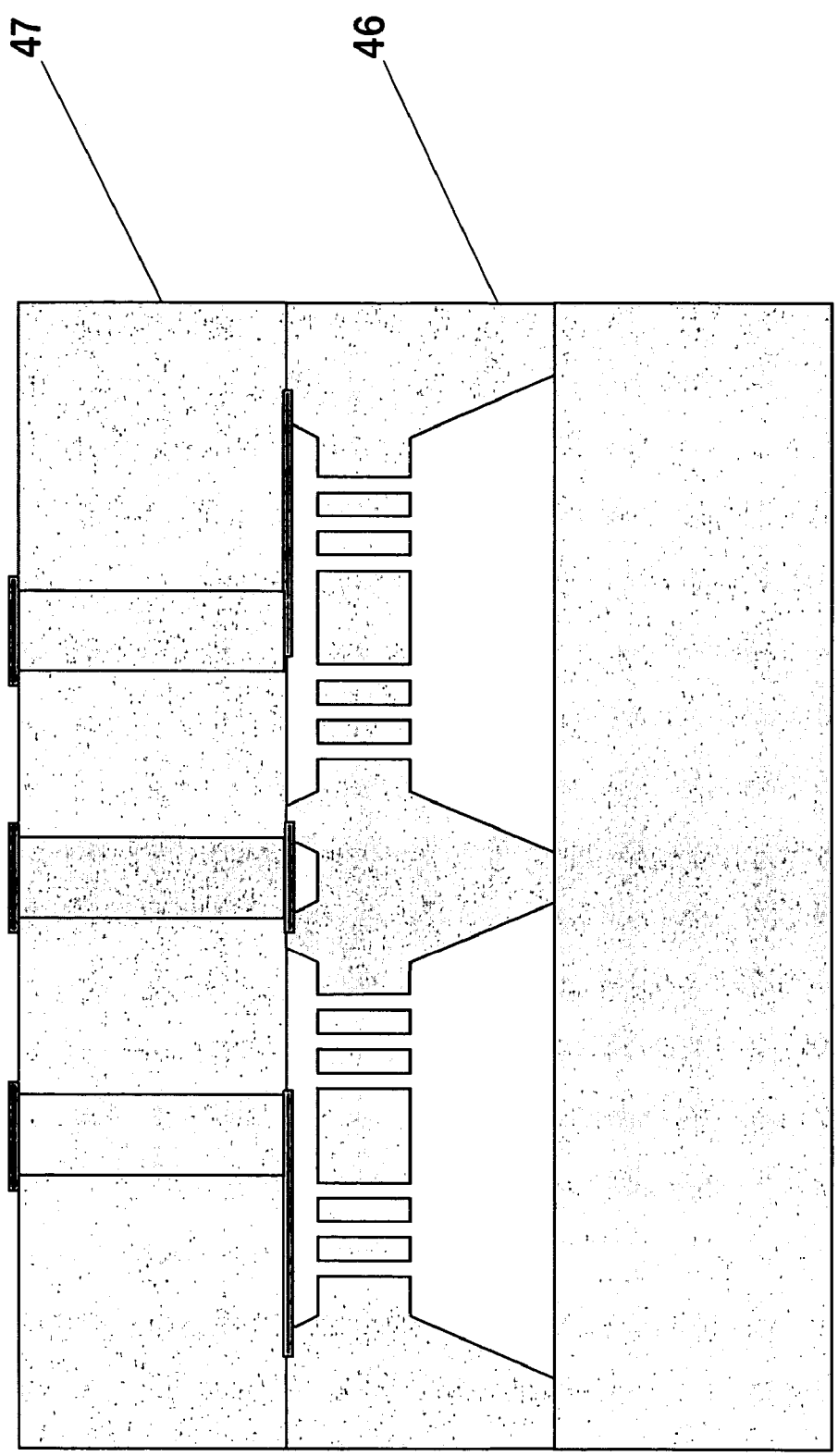
FIG. 8 shows a sectional view of joining the cover part of a microelectromechanical component solution, according to the invention, to a microelectromechanical chip part.

FIG. 8 shows a sectional view of joining the cover part of a microelectromechanical component solution, according to the invention, to a microelectromechanical chip part. In the solution according to the invention, the microelectromechanical chip part 46 is sealed by means of the cover part 47, having lead-in structures for bringing electric connections through the cover part 47. In the solution according to the invention, electric connections are brought by means of silicon lead-ins from the microelectromechanical chip part 46 at the bottom to the plane surface of the glass cover part 47.

Formation of a joint between the conductive lead-in of the cover part 47 of the microelectromechanical component solution and the microelectromechanical chip part 46 can occur directly, by means of metal layers on the surface, by means of a soldering bump, or by some other bonding means, or by other means.

Figure 9:
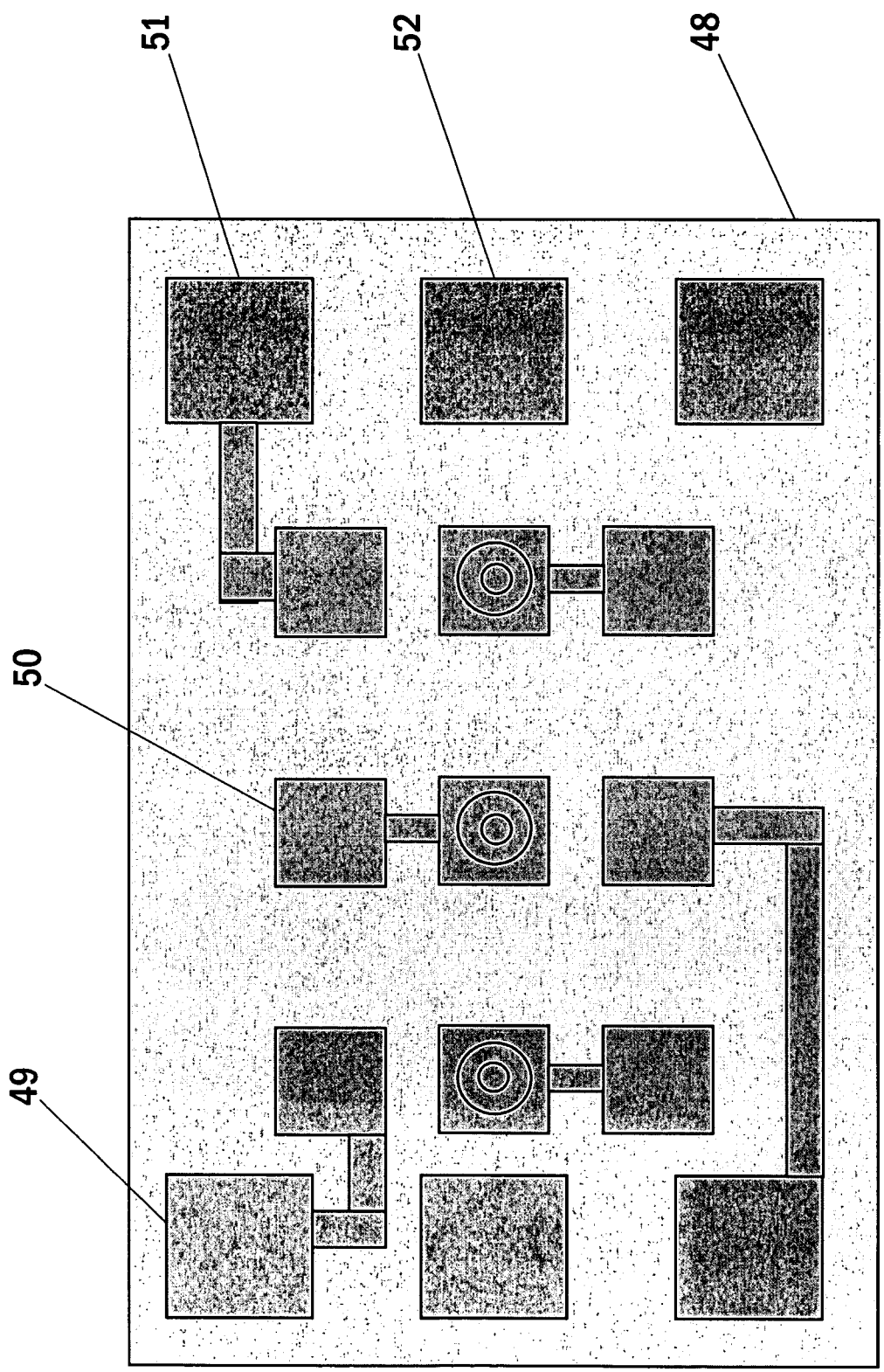
FIG. 9 shows a projection view of an exemplifying redistribution layer solution of the cover part of a microelectromechanical component solution according to the invention.

FIG. 9 shows a projection view of an exemplifying redistribution layer solution of the cover part of a microelectromechanical component solution according to the invention. On the surface of the cover part 48 of a microelectromechanical component solution according to the invention, conductive contact areas 49-52 are manufactured by means of a redistribution layer 49-52, which conductive areas provide an electric conductive connection between the lead-ins and soldering bumps later to be installed onto the surface. Such said contact areas 49-52 are contact areas both for an electronic circuit part and contact areas for external connections of the microelectromechanical component solution.

The redistribution layer 49-52 is manufactured either before or after attaching the cover part 48 of the microelectromechanical component solution to the microelectromechanical chip part. The conductive redistribution layer 49-52, according to the invention, enables positions for the lead-in and the bump as preferable as possible for both of them independent of the position of the other. By means of the conductive redistribution layer 49-52, a connection can be created, besides between a lead-in and a bump, also between soldering bumps serving different purposes.

Figure 10:
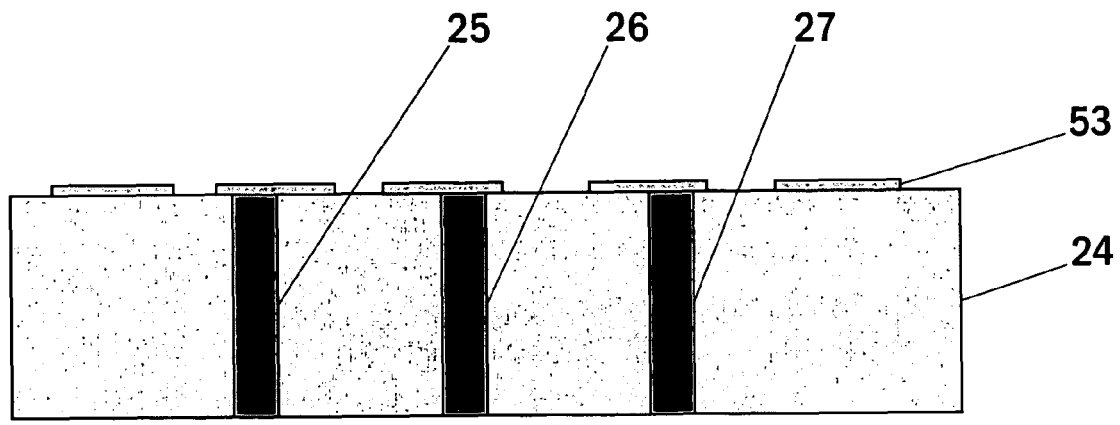
FIG. 10 shows a sectional view of an exemplifying redistribution layer solution of the cover part of a microelectromechanical component solution according to the invention.

FIG. 10 shows a sectional view of an exemplifying redistribution layer solution of the cover part of a microelectromechanical component solution according to the invention. The exemplifying cover part of a microelectromechanical component solution, according to the invention, is indicated by the numeral 24, and typically it is mainly made of glass. The cover part 24 comprises conductive areas 25-27 extending through the glass element, which conductive areas 25-27 typically are made of silicon.

On the surface of the exemplifying cover part 24 of a microelectromechanical component solution, according to the invention, a conductive redistribution layer 53 is manufactured, which provides an electric conductive connection between the lead-ins and soldering bumps later to be installed onto the surface. Since the exemplifying cover part 24 is made mainly of a dielectric material, the conductive redistribution layer 53 can be located directly on the surface of the cover part 24.

Figure 11:
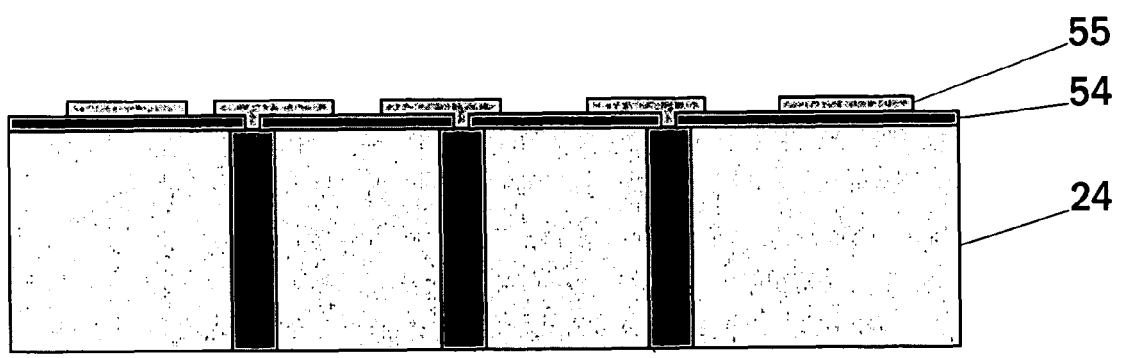
FIG. 11 shows a sectional view of an alternative redistribution layer solution of the cover part of a microelectromechanical component solution according to the invention.

FIG. 11 shows a sectional view of an alternative redistribution layer solution of the cover part of a microelectromechanical component solution according to the invention. The cover part of the microelectromechanical component solution, according to the invention, is indicated by the numeral 24, and, typically, it is mainly made of glass. The cover part 24 comprises conductive areas extending through the glass element, which conductive areas typically are made of silicon.

Firstly, onto the surface of the cover part 24 of a microelectromechanical component solution, according to the invention, a dielectric layer 54 is manufactured. By means of the dielectric layer 54 of the cover part 24, according to the invention, an optimal strength of the surface of the cover part 24 can be achieved, for example. Next, onto the surface of the cover part 24, according to the invention, a conductive redistribution layer 55 is manufactured, which provides an electric conductive connection between the lead-ins and soldering bumps later to be installed onto the surface. The structure of the redistribution layer 55 and the functions of its various areas are the same as those depicted in the projection view of FIG. 9 for the redistribution layer manufactured directly onto the surface of the lead-in wafer.

Figure 12:
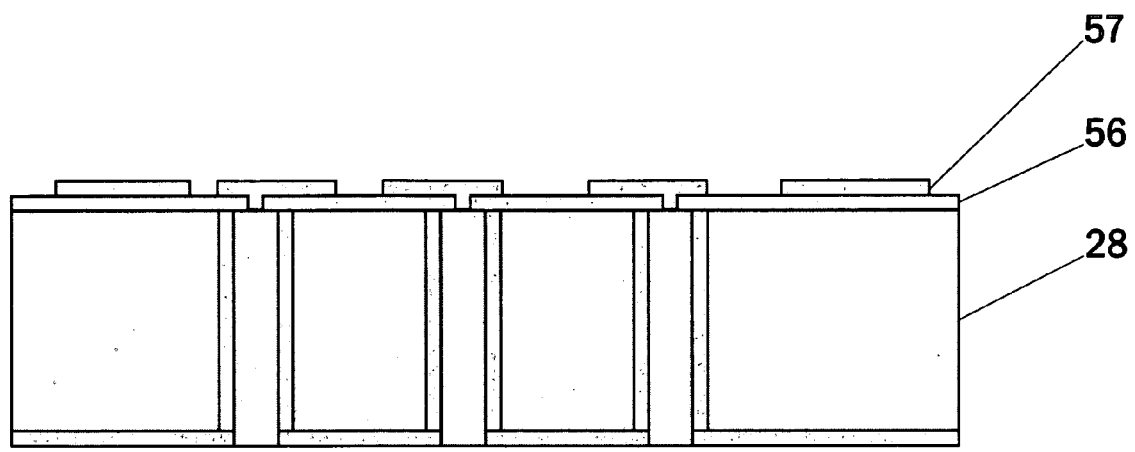
FIG. 12 shows a sectional view of a second alternative redistribution layer solution of the cover part of a microelectromechanical component solution according to the invention.

FIG. 12 shows a sectional view of a second alternative redistribution layer solution of the cover part of a microelectromechanical component solution according to the invention. The cover part of the microelectromechanical component solution, according to the invention, is indicated by the numeral 28, and it is mainly made of silicon. The cover part 28 comprises conductive areas extending through the silicon element, which conductive areas typically are made of silicon. The conductive areas of the cover part 28 are isolated from the body of the cover part 28 by means of a glass insulator, which also isolates the bottom of the cover part 28.

Firstly, onto the surface of the cover part 28 of a microelectromechanical component solution, according to the invention, a dielectric layer 56 is manufactured. By means of the dielectric layer 56 of the cover part 28, according to the invention, an optimal strength of the surface of the cover part 28 can be achieved, for example. The dielectric layer is also necessitated by the choice of material for the cover part. Next, onto the surface of the cover part 28, according to the invention, a conductive redistribution layer 57 is manufactured, which provides an electric conductive connection between the lead-ins and soldering bumps later to be installed onto the surface.

Figure 13:
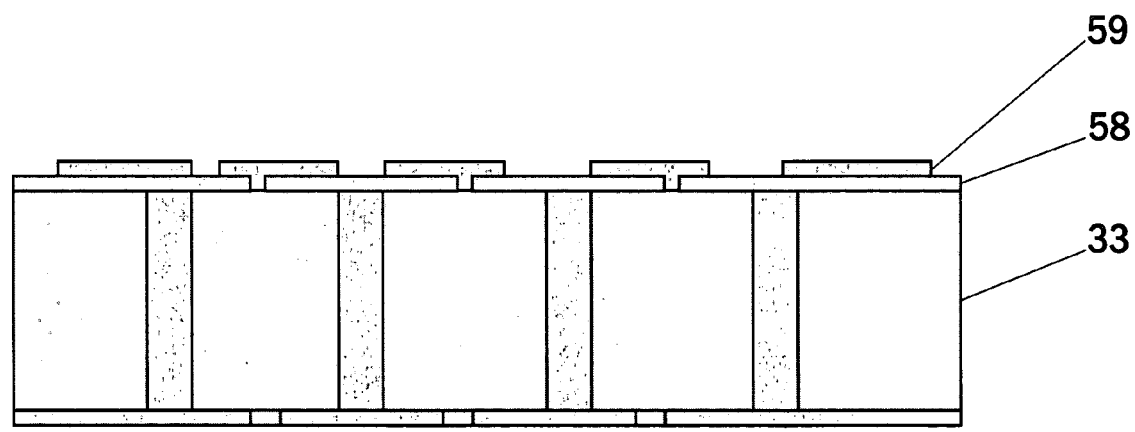
FIG. 13 shows a sectional view of a third alternative redistribution layer solution of the cover part of a microelectromechanical component solution according to the invention.

FIG. 13 shows a sectional view of a third alternative redistribution layer solution of the cover part of a microelectromechanical component solution according to the invention. The cover part of the microelectromechanical component solution, according to the invention, is indicated by the numeral 33, and it is mainly made of silicon. The cover part 33 is divided into strip-like conductive areas by means of narrow glass insulators. The conductive areas typically are made of silicon. The glass insulators of the second alternative cover part 33 also isolate the bottom of the cover part 33.

Firstly, onto the surface of the cover part 33 of the microelectromechanical component solution, according to the invention, a dielectric layer 58 is manufactured. By means of the dielectric layer 58 of the cover part 33, according to the invention, an optimal strength of the surface of the cover part33 can be achieved, for example. The dielectric layer is also necessitated by the choice of material for the cover part. Next, onto the surface of the cover part 33, according to the invention, a conductive redistribution layer 59 is manufactured, which provides an electric conductive connection between the lead-ins and soldering bumps later to be installed onto the surface.

Figure 14:
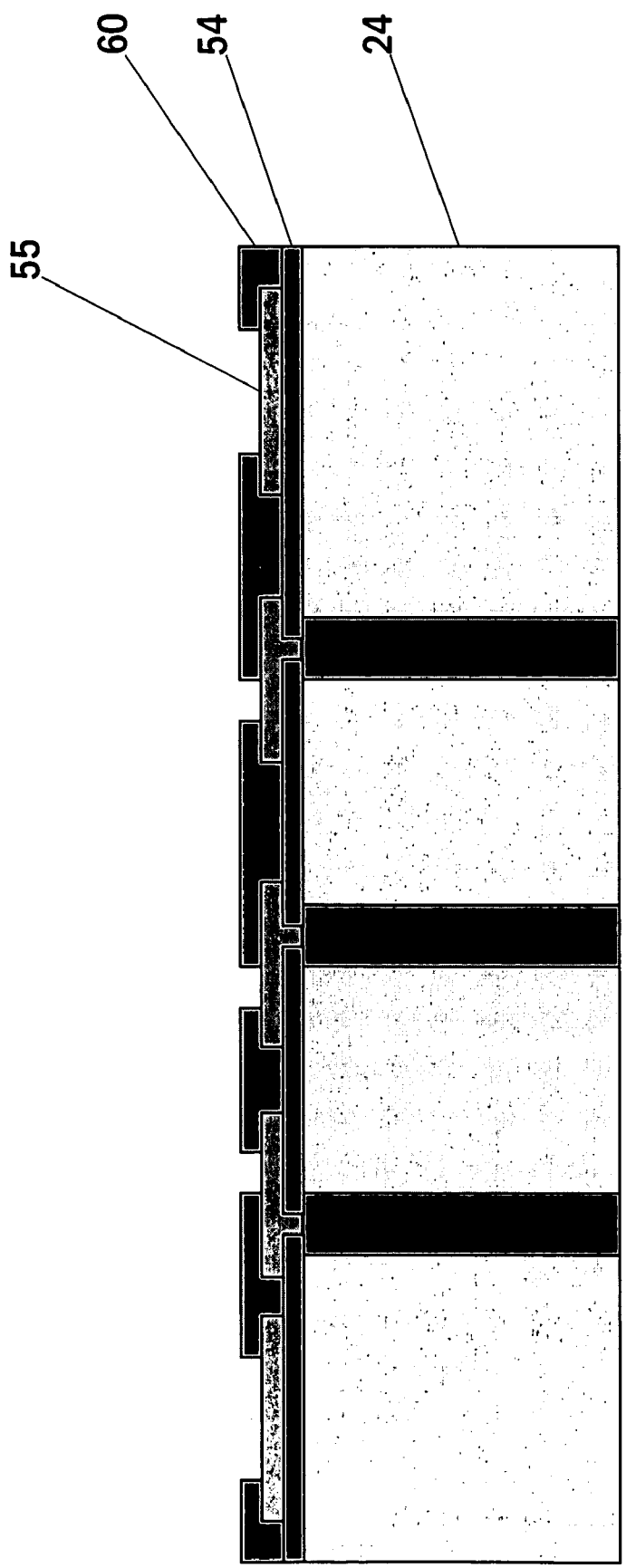
FIG. 14 shows a sectional view of an exemplifying protective layer solution for the cover part of a microelectromechanical component solution according to the invention.

FIG. 14 shows a sectional view of an exemplifying protective layer solution for the cover part of a microelectromechanical component solution according to the invention. The cover part of the microelectromechanical component solution, according to the invention, is indicated by the numeral 24, and, typically, it is mainly made of glass. The cover part 24 comprises conductive areas extending through the glass element, which conductive areas typically are made of silicon. Firstly, onto the surface of the cover part 24, a dielectric layer 54 is manufactured, and, subsequently, a conductive redistribution layer 55, which provides an electric conductive connection between the lead-ins and soldering bumps later to be installed onto the surface.

On top of the redistribution layer 55 of the cover part 24 of the microelectromechanical component solution, according to the invention, additionally, a protective layer 60 is manufactured, which protection layer is made of a dielectric material. The protective layer 60 covers the entire surface, except for openings, into which connections such as bump, wire, adhesive, soldering, or other connections later are desired to be made. Such said openings are both contact areas for an electronic circuit part and contact areas for external connections of the microelectromechanical component solution. The object of the protective layer 60 is to protect the metal layers from environmental effects and to limit the surface area of a soldering bump joint, when the soldering bump joint is are melted.

A protective layer similar to the protective layer 60 can equally well be used in connection with the redistribution layer solutions of FIGS. 10, 12, and 13.

Figure 15:
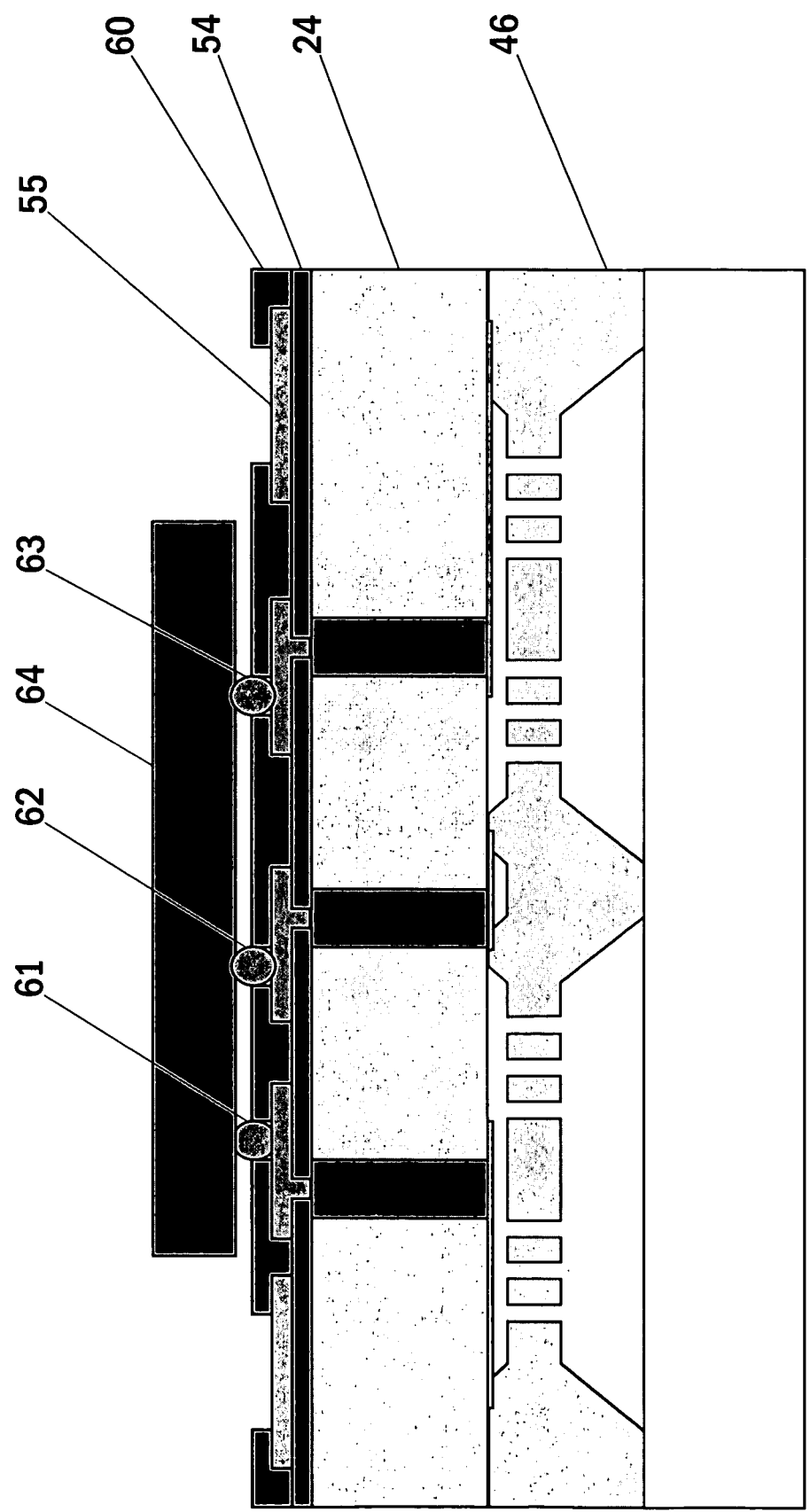
FIG. 15 shows a sectional view of an implementation of a microelectromechanical component solution according to the invention, whereby an electronic circuit part is attached on top of a microelectromechanical chip part.

FIG. 15 shows a sectional view of an implementation of a microelectromechanical component solution, according to the invention, whereby an electronic circuit part is attached on top of a microelectromechanical chip part. In the solution according to the invention, the microelectromechanical chip part 46 is sealed by a cover part 24, comprising lead-in structures for bringing electric connections through the cover part 24. Firstly, a dielectric layer 54 is manufactured onto the surface of the cover part 24, then a conductive redistribution layer 55 and, further, a protective layer 60 made of a dielectric material.

By means of methods generally used in applying the flip-flop bonding method, bonding bumps 61-63 are manufactured onto the surface of the circuit part 64 of the microelectromechanical component solution according to the invention. The bumps form a conductive connection with the signal processing circuit of the circuit part. In the solution according to the invention, the circuit part is attached by the flip-flop bonding method onto the surface of the cover part 24 protecting the microelectromechanical chip part 46, such that the bumps 61-63 line up with the openings of the protective layer 60, and form a conductive connection with the conductive areas of the redistribution layer 55 and further via the lead-in structures through the cover part 24 to the areas of the conductive layer located on top of the surface of the microelectromechanical chip part 46 or on the dielectric layer. In the solution according to the invention, the formation of a joint between the conductive lead-in of the cover part 24 of the microelectromechanical component solution and the microelectromechanical chip part 46 can occur directly, by means of metal layers on the surface, by a soldering bump, or via some other connection means, or by some other method.

Alternatively, the microelectromechanical chip part 46 of the microelectromechanical component solution, according to the invention, is protected by a cover part 24, on top of the redistribution layer 55 of which cover part 24, into the openings of the protective layer 60, bonding bumps 61-63 are manufactured. The bonding bumps 61-63, manufactured onto the surface of the cover part 24 of the microelectromechanical component solution, form a conductive connection via the redistribution layer 55 and further via the lead-in structures through the cover part 24 to the areas of the conductive layer located on the surface of the microelectromechanical chip part 46 or on the dielectric layer. In the solution according to the invention, the formation of a joint between the conductive lead-in of the cover part 24 of the microelectromechanical component solution and the microelectromechanical chip part 46 can occur directly, by means of metal layers on the surface, via a soldering bump, or via some other connection means, or by some other methods.

Further, preferably, in the solution according to the invention, the electronic circuit part 64 is bonded by means of the flip-flop bonding method onto the surface of the cover part 24 protecting the microelectromechanical chip part 46. The bonding bumps 61-63 manufactured onto the surface of the cover part 24 of the microelectromechanical component solution form a conductive connection between the microelectromechanical chip part 46 and the electronic circuit part 64.

Figure 16:
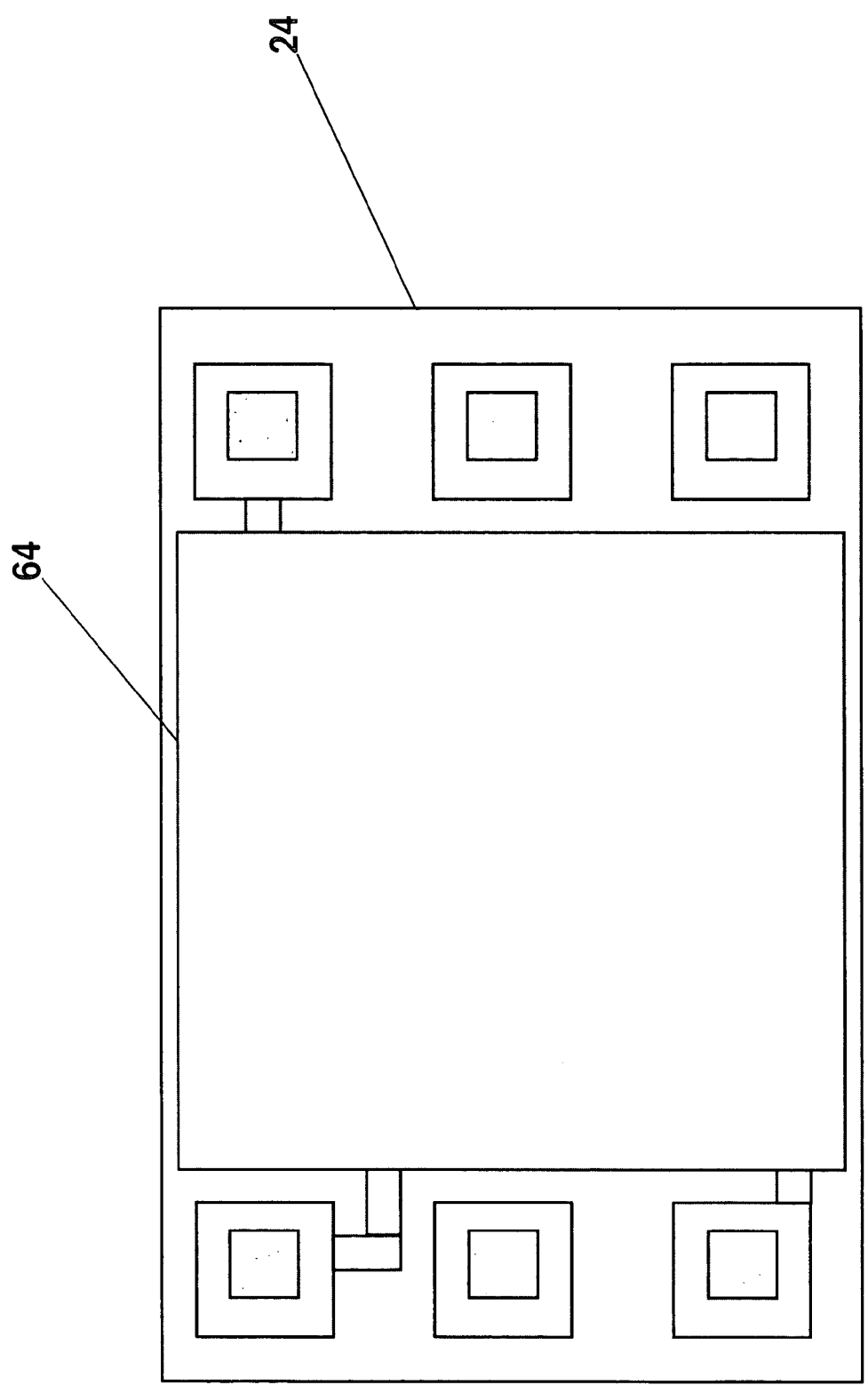
FIG. 16 shows a projection view of an implementation of the microelectromechanical component solution, according to the invention, whereby an electronic circuit part is attached on top of a microelectromechanical chip part.

FIG. 16 shows a projection view of an implementation of the microelectromechanical component solution, according to the invention, whereby an electronic circuit part is attached on top of the microelectromechanical chip part. In the solution according to the invention, an electronic circuit part 64 is bonded by means of the flip-flop bonding method onto the surface of the cover part 24 protecting the microelectromechanical chip part. In the solution according to the invention, the electronic circuit part 64 has to be smaller than the microelectromechanical chip part, so that necessary contact areas for the external connections of the microelectromechanical component solution remain on the surface of the cover part 24 protecting the microelectromechanical chip part.

Figure 17:
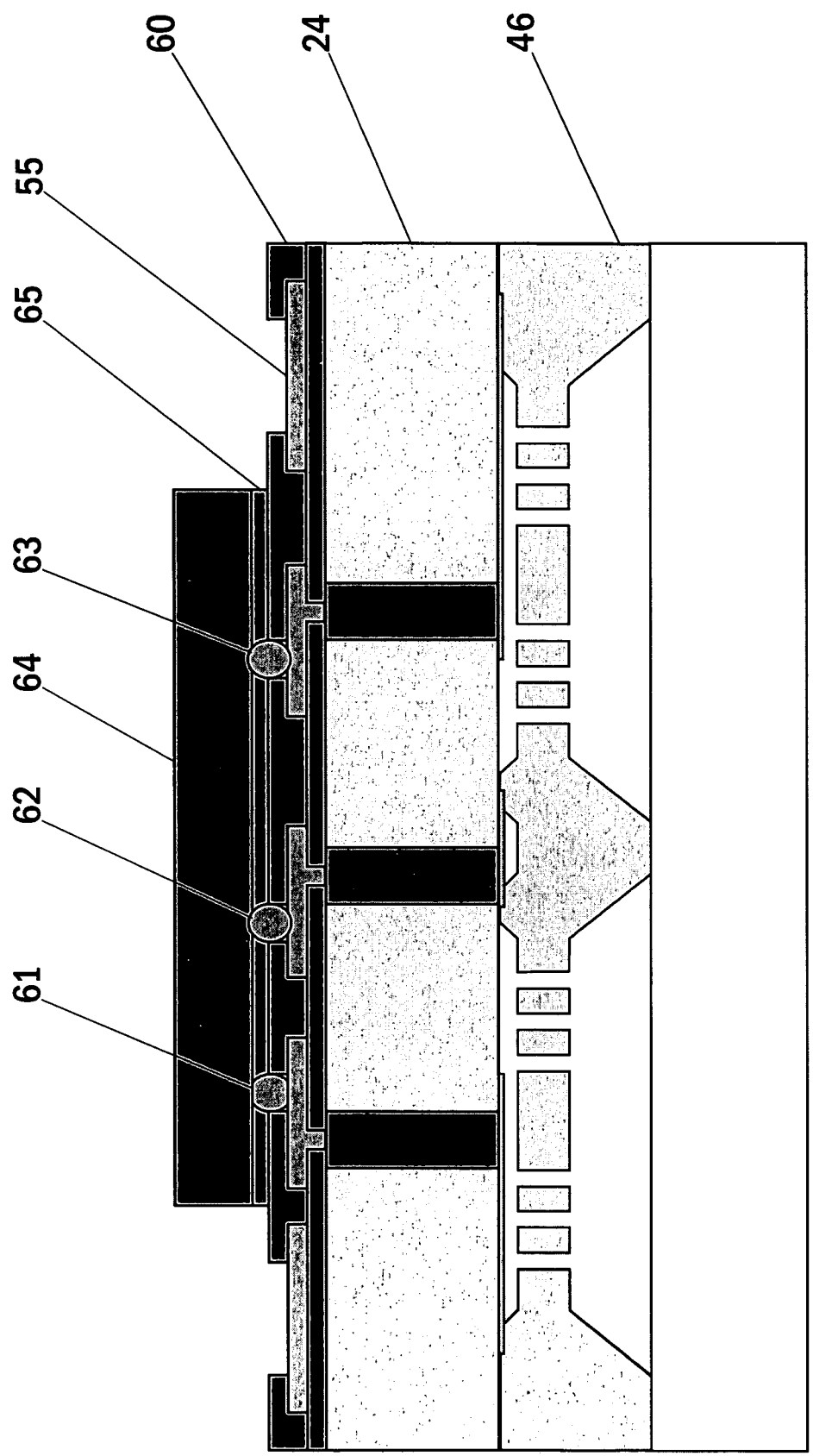
FIG. 17 shows a sectional view of an underfill solution of an electronic circuit part of a microelectromechanical component solution according to the invention.

FIG. 17 shows a sectional view of an underfill solution of an electronic circuit part of the microelectromechanical component solution according to the invention. In the solution according to the invention, a cover part 24 protects the microelectromechanical chip part 46 of the microelectromechanical component, on a redistribution layer 55 of which cover part 24, into openings in a protective layer 60, bonding bumps 61-63 are aligned, or, alternatively, manufactured. The electronic circuit part 64 of the microelectromechanical component is, by means of the flip-flop method, bonded to the surface of the cover part 24 protecting the microelectromechanical chip part 46.

In the solution according to the invention, the narrow gap between the electronic circuit part 64, bonded by means of the flip-flop method, and the cover part 24 of the microelectromechanical chip part 46, is filled with an underfill 65. In electronics, filling with an underfill 65 is a generally used technique, which has proved a good method for improving the reliability of a circuit solution. In the solution according to the invention, the underfill 65 serves well as a protection against various harmful materials from the environment, such as dampness. Since the electrically sensitive areas of the electronic circuit part 64 and the microelectromechanical chip part 46 are facing each other, and the space between them is sealed with the underfill 65, the microelectromechanical component can be used without a plastic cast capsule, should that be desirable.

Figure 18:
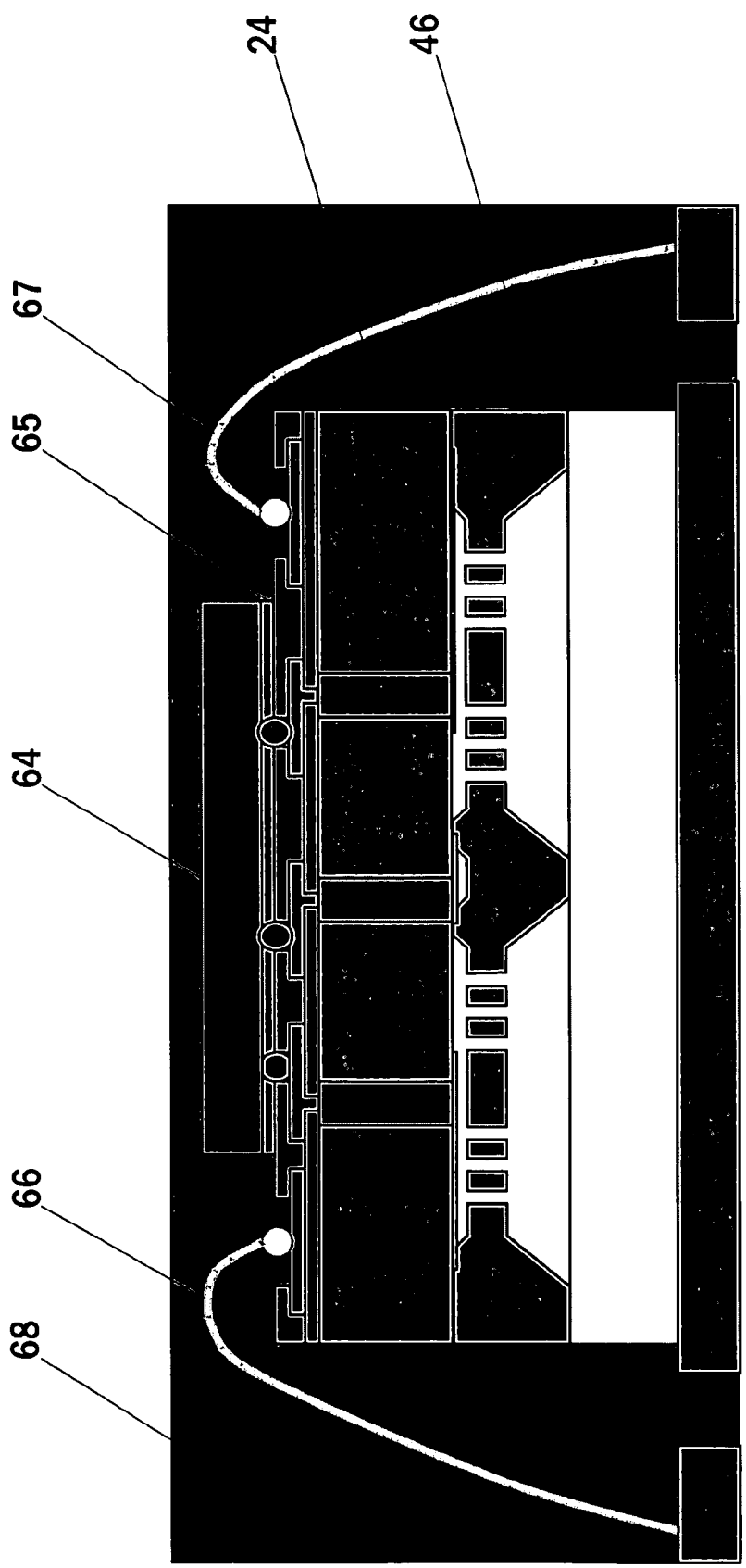
FIG. 18 shows a sectional view of an exemplifying implementation solution of the external connections of a microelectromechanical component solution according to the invention.

FIG. 18 shows a sectional view of an exemplifying implementation solution of the external connections of a microelectromechanical component solution according to the invention. In the solution according to the invention, a cover part 24 protects the microelectromechanical chip part 46 of the microelectromechanical component. The electronic circuit part 64 of the microelectromechanical component is, by means of the flip-flop method, bonded to the surface of the cover part 24 protecting the microelectromechanical chip part 46. The narrow gap between the electronic circuit part 64 of the microelectromechanical component and the cover part 24 of the microelectromechanical chip part 46 is filled with an underfill 65.

In the exemplifying external connection solution according to the invention, the external connections of the microelectromechanical component containing the microelectromechanical chip part 46 and the electronic circuit part 64 are implemented by means of wire connections 66, 67. The Figure also indicates a plastic cast capsule 68 to be cast over the unit formed by the microelectromechanical component.

The microelectromechanical component containing the microelectromechanical chip part 46 and the electronic circuit part 64 can be connected to the outside by means of any known connection solution. Such connection solutions include, in addition to the wire connection 66, 67, also bump connectors, conducting adhesive joints, or a direct soldering solution.

Figure 19:
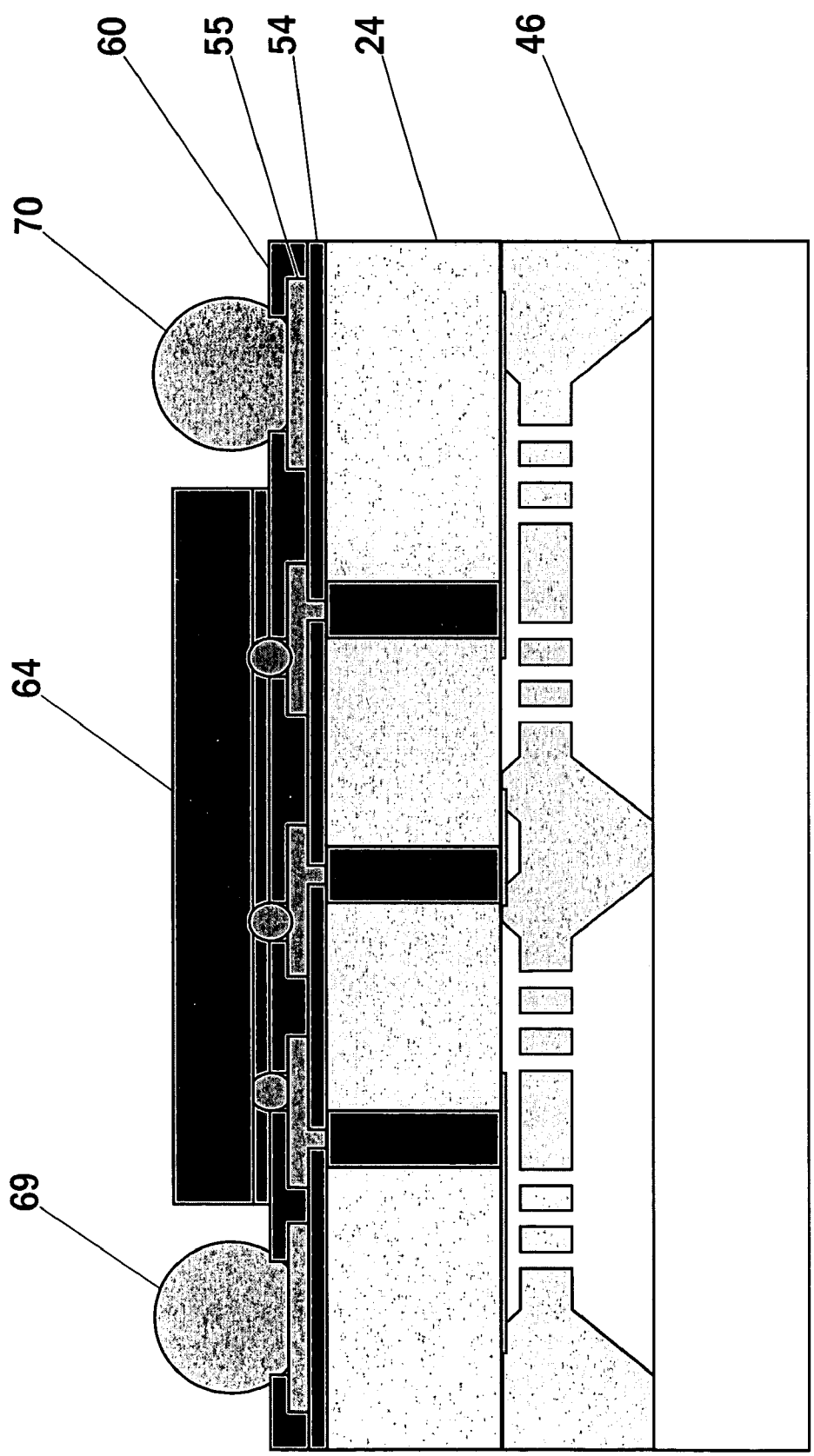
FIG. 19 shows a sectional view of a bump connector solution of a microelectromechanical component solution according to the invention.

FIG. 19 shows a sectional view of a bump connector solution of a microelectromechanical component solution according to the invention. In the solution according to the invention, a cover part 24 protects the microelectromechanical chip part 46 of the microelectromechanical component. Firstly, a dielectric layer 54 is manufactured onto the surface of the cover part 24, then a conductive redistribution layer 55, and further a protective layer 60 made of a dielectric material. The electronic circuit part 64 of the microelectromechanical component is, by means of the flip-flop method, bonded to the surface of the cover part 24 protecting the microelectromechanical chip part.

The cover part 24 protects the microelectromechanical chip part 46 of the microelectromechanical component solution according to the invention, on a redistribution layer 55 of which cover part 24, into openings in a protective layer 60, bonding bumps 69, 70 are manufactured for the external connections of the microelectromechanical component. In the bump connector solution of the microelectromechanical component, according to the invention, the external connections of the microelectromechanical component containing the microelectromechanical chip part 46 and the electronic circuit part 64 are implemented by means of bump connectors 69, 70. The height of the bump connectors 69, 70 is at least equal to the total height of the electronic circuit part 64 and the flip-flop bonding bumps 61-63. The bump connectors 69, 70 can also be deposited or installed before the flip-flop bonding or interleaved with the manufacturing of the flip-flop bond.

When, in the solution according to the invention, the bump connectors 69, 70 are manufactured onto the microelectromechanical component, a microelectromechanical component is obtained suitable for a soldering process without any separate encapsulation.

Figure 20:
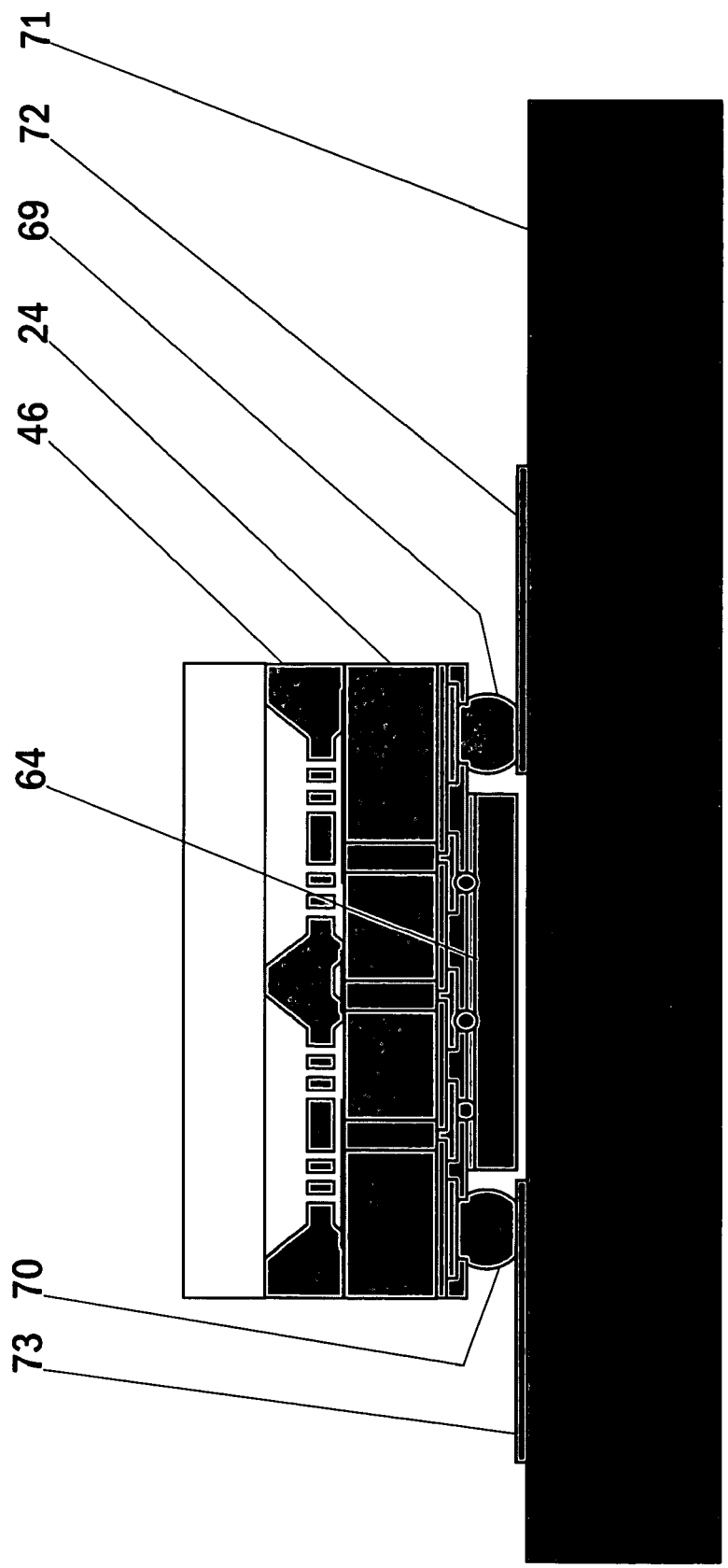
FIG. 20 shows a sectional view of attaching a microelectromechanical component solution, according to the invention, to a circuit board by means of a bump connector solution.

FIG. 20 shows a sectional view of attaching a microelectromechanical component solution, according to the invention, to a circuit board by means of a bump connector solution. In the solution according to the invention, a cover part 24 protects the microelectromechanical chip part 46 of the microelectromechanical component. The electronic circuit part 64 of the microelectromechanical component is, by means of, for example, the flip-flop method, bonded to the surface of the cover part 24 protecting the microelectromechanical chip part 46.

Bump connectors 69, 70 are manufactured onto the surface of he cover part 24 of the microelectromechanical component solution, according to the invention, for connecting the microelectromechanical component to a circuit board. The height of the bump connectors 69, 70 is at least equal to the total height of the electronic circuit part 64 and the flip-flop bonding bumps 61-63. In the solution according to the invention, the microelectromechanical component solution is connected to the surface of a circuit board 71 by the flip-flop method, for example, such that the bonding bumps 69, 70 in a suitable manner line up with connection areas 72, 73 of the circuit board 71.

Figure 21:
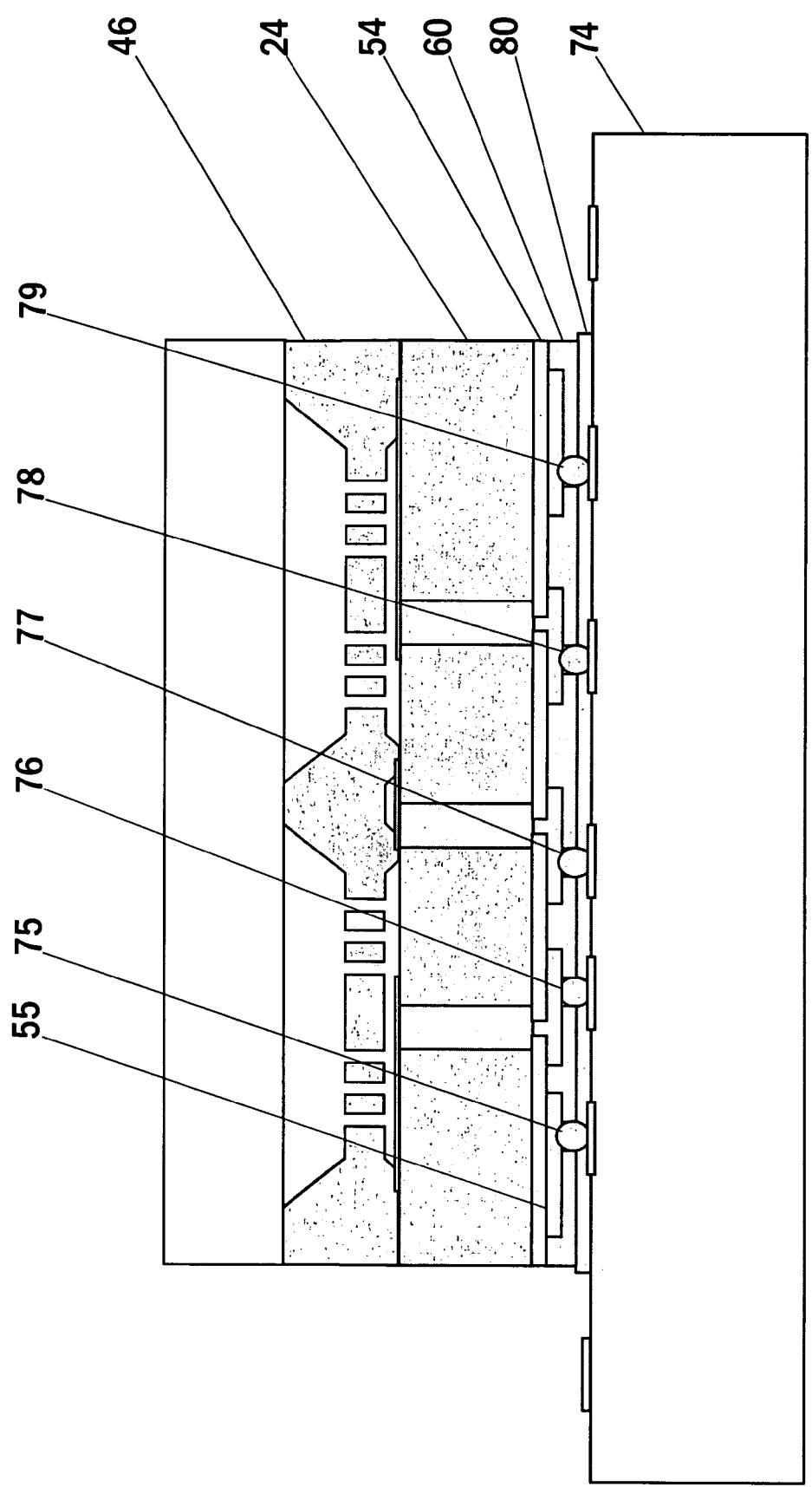
FIG. 21 shows a sectional view of an implementation of an alternative microelectromechanical component solution according to the invention, whereby a microelectromechanical chip part is attached on top of the electronic circuit part.

FIG. 21 shows a sectional view of an implementation of an alternative microelectromechanical component solution according to the invention, whereby a microelectromechanical chip part is attached on top of the electronic circuit part. In the solution according to the invention, the microelectromechanical chip part 46 is sealed by a cover part 24 having lead-in structures for bringing electric connections through the cover part 24. On the surface of the cover part 24, a dielectric layer 54 is manufactured, thereafter a conductive redistribution layer 55, and further a protection layer 60 made of a dielectric material.

Onto suitable spots of the surface of the electronic circuit part 74 of the microelectromechanical component solution according to the invention, bonding bumps 75-79 are manufactured, or, alternatively, the bonding bumps 75-79 are manufactured onto the surface of the cover part 24 protecting the microelectromechanical chip part 46 onto the redistribution layer 55 into openings of the protective layer 60. In the solution according to the invention, the microelectromechanical chip part 46 is bonded, by means of the flip-flop method, to the surface of the electronic circuit part 74 the cover part 24 facing the surface of the electronic circuit part 74. The bonding bumps 75-79 of the microelectromechanical component solution form a conductive connection between the microelectromechanical chip part 46 and the electronic circuit part 74. The narrow gap between the electronic circuit part 74 and the cover part 24 of the microelectromechanical chip part 46 is filled with an underfill 80.

Figure 22:
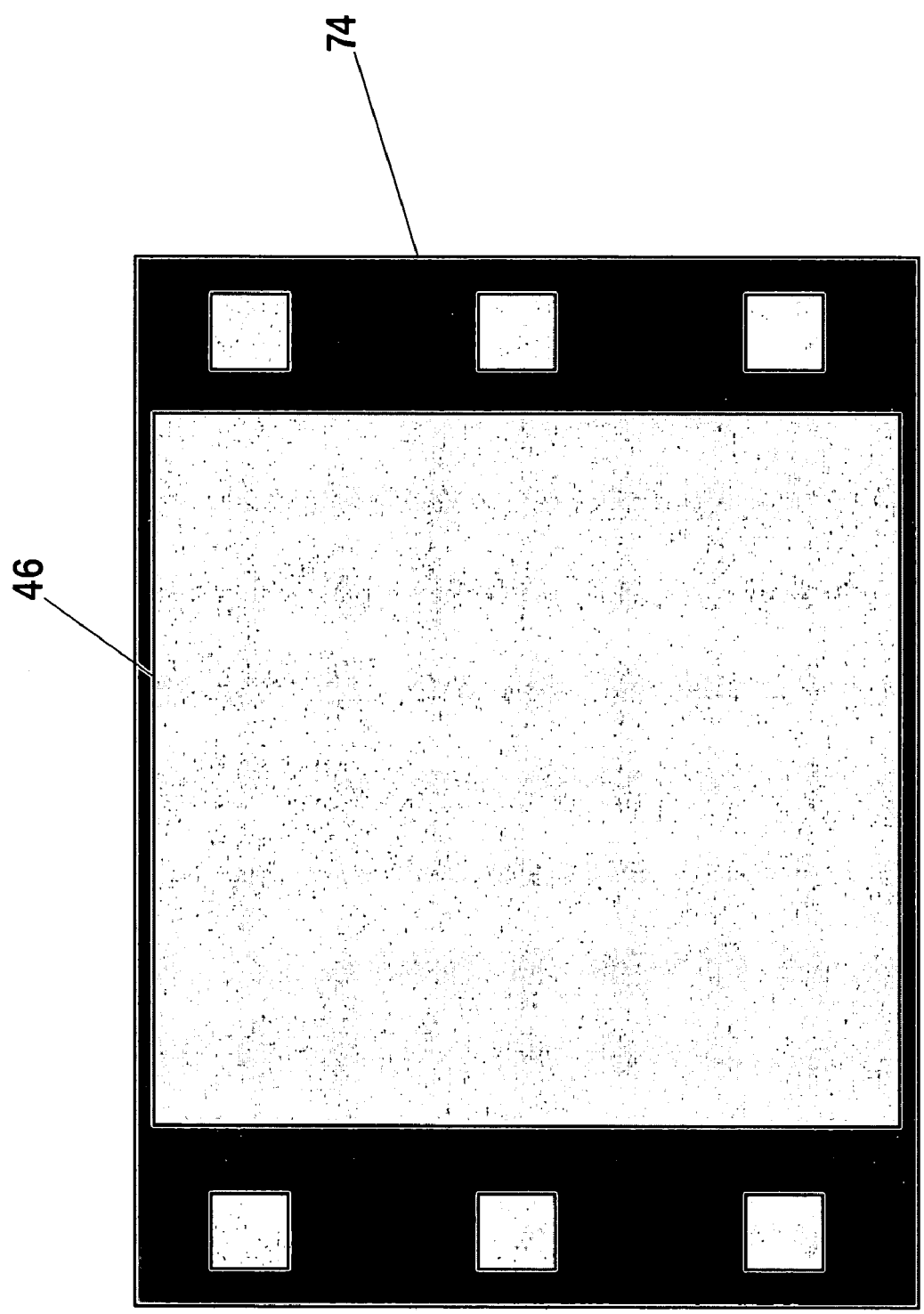
FIG. 22 shows a projection view of an implementation of an alternative microelectromechanical component solution, according to the invention, whereby the microelectromechanical chip part is attached on top of the electronic circuit part.

FIG. 22 shows a projection view of an implementation of an alternative microelectromechanical component solution according to the invention, whereby the microelectromechanical chip part is attached on top of the electronic circuit part. In the solution according to the invention, the microelectromechanical chip part 46 is bonded to the surface of the electronic circuit part 74 by means of the flip-flop method. In the solution according to the invention, the microelectromechanical chip part 46 must be smaller than the electronic circuit part 74, so that the necessary contact areas remain on the surface of the electronic circuit part 74 for the external connections of the microelectromechanical component solution.

Figure 23:
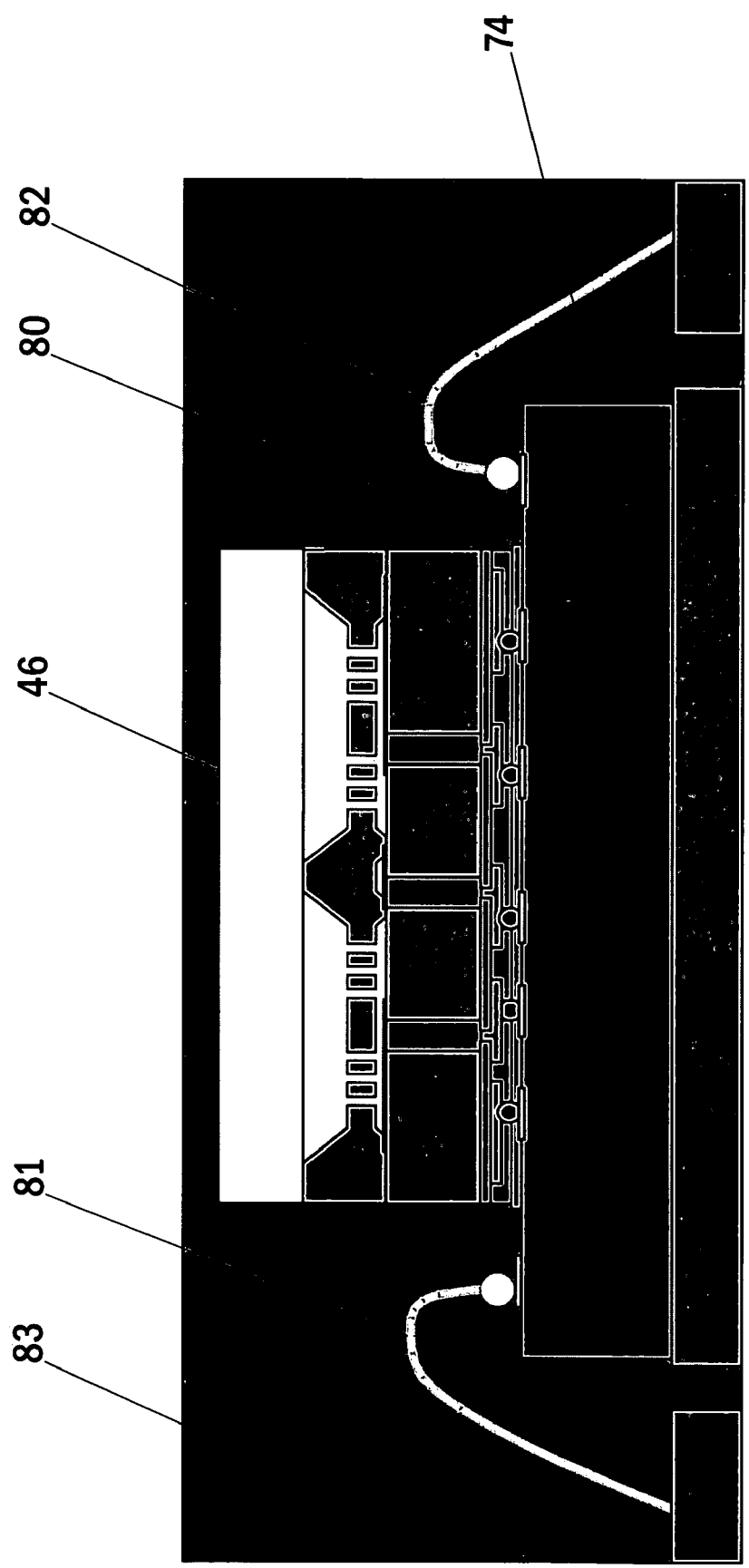
FIG. 23 shows a sectional view of an exemplifying external connection implementation solution of the alternative microelectromechanical component solution according to the invention.

FIG. 23 shows a sectional view of an exemplifying external connection implementation solution of the alternative microelectromechanical component solution according to the invention. In the solution according to the invention, the microelectromechanical chip part 46 of the microelectromechanical component is bonded to the surface of the electronic circuit part 74 by means of the flip-flop method. The narrow gap between the electronic circuit part 74 and the cover part of the microelectromechanical chip part 46 is filled with an underfill 80.

In the exemplifying external connection implementation solution according to the invention, the external connections of the microelectromechanical component containing the microelectromechanical chip part 46 and the electronic circuit part 74 are implemented by means of wire connections 81, 82. In the Figure, also a cast plastic capsule 83 to be cast onto the unit formed by microelectromechanical component.

The microelectromechanical component containing the microelectromechanical chip part 46 and the electronic circuit part 74 can be connected to the external world by means of any known connection solution. Such connection solutions include, in addition to the wire connection 81, 82, also bump connectors, conducting adhesive joints, or a direct soldering solution.

Figure 24:
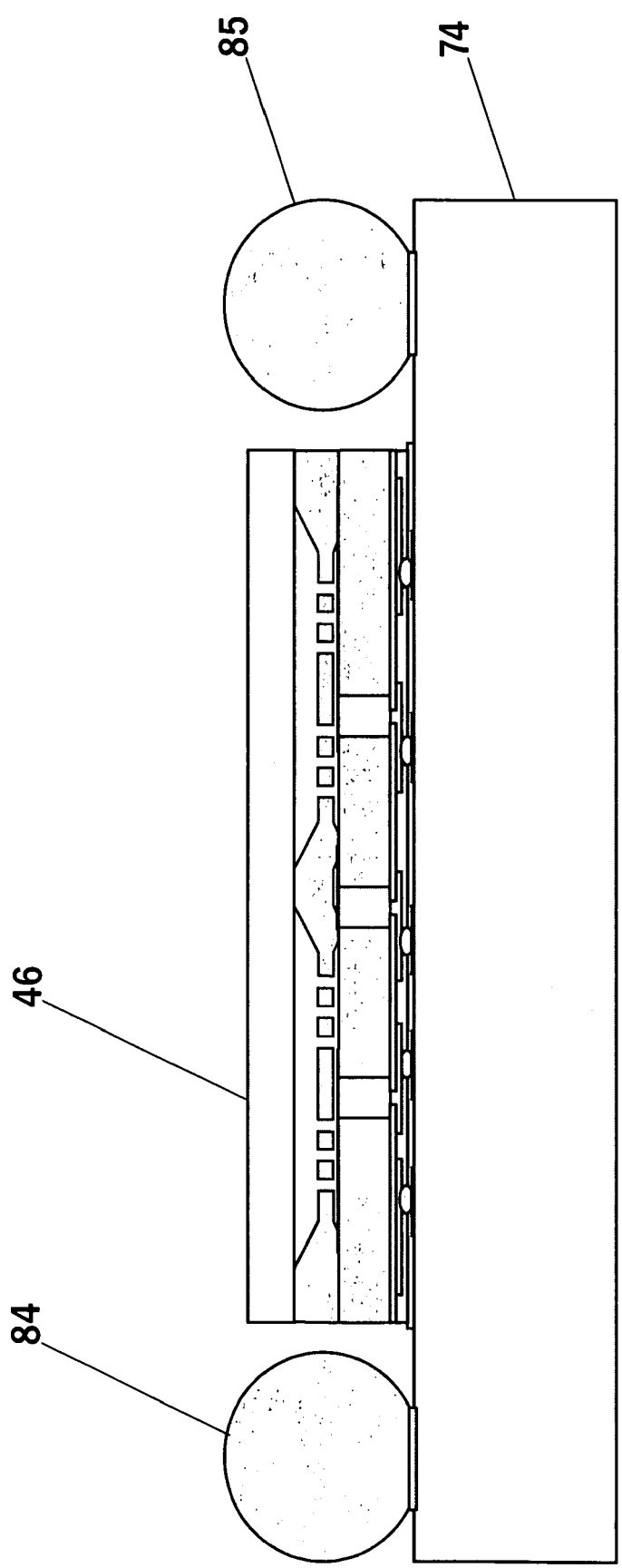
FIG. 24 shows a sectional view of a bump connector solution of the alternative microelectromechanical component solution according to the invention.

FIG. 24 shows a sectional view of a bump connector solution of the alternative microelectromechanical component solution according to the invention. In the solution according to the invention, the microelectromechanical chip part 46 is bonded to the surface of the electronic circuit part 74 by means of the flip-flop method. Onto suitable spots on the surface of the electronic circuit part 74 of the microelectromechanical component solution according to the invention, bump connectors 84, 85 are manufactured for the external connections of the microelectromechanical component.

In the alternative bump connector solution of the microelectromechanical component solution according to the invention, the external connections of the microelectromechanical component containing the microelectromechanical chip part 46 and the electronic circuit part 74 are implemented by means of bump connectors 84, 85. The height of the bump connectors 84, 85 is at least equal to the total height of the microelectromechanical chip part 46 and the flip-flop bonding bumps 75-79. The bump connectors 84, 85 can also be deposited or installed before the flip-flop bonding or interleaved with the manufacturing of the flip-flop bonding.

When, in the solution according to the invention, bump connectors 84, 85 are manufactured onto the microelectromechanical component, a microelectromechanical component is obtained suitable for a soldering process without any separate encapsulation.

Figure 25:
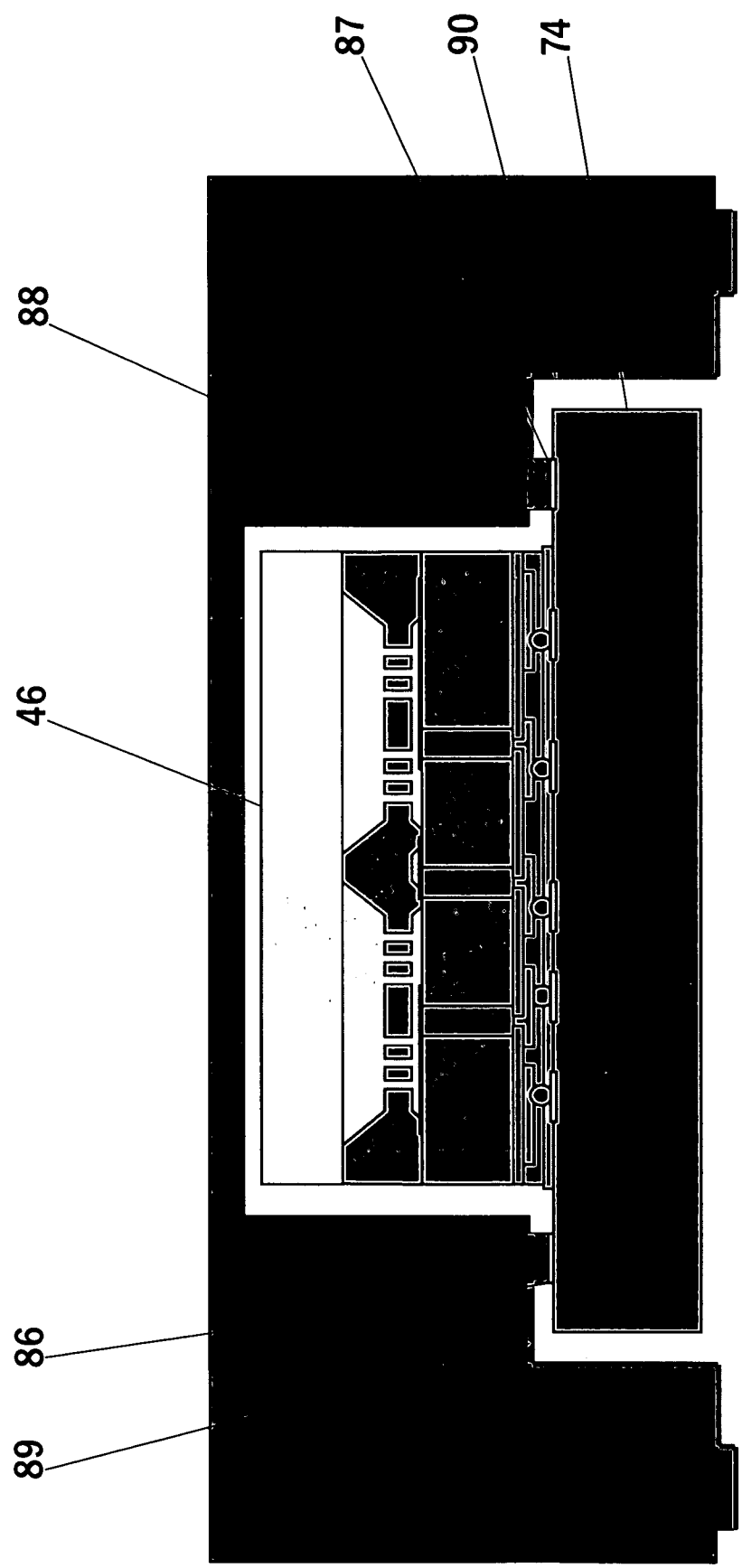
FIG. 25 shows a sectional view of an adhesive joint solution of the alternative microelectromechanical component solution according to the invention.

FIG. 25 shows a sectional view of an adhesive joint solution of an alternative microelectromechanical component solution according to the invention. In the solution according to the invention, the microelectromechanical chip part 46 of the microelectromechanical component is bonded to the surface of the electronic circuit part 74 by means of the flip-flop method. Onto the surface of the electronic circuit part 74 of the microelectromechanical component solution according to the invention, adhesive joints 86, 87 are manufactured in suitable spots for the external connections of the microelectromechanical component.

In the alternative adhesive joint solution of the microelectromechanical component solution according to the invention, the external connections of the microelectromechanical component containing the microelectromechanical chip part 46 and the electronic circuit part 74 are implemented by means of the adhesive joints 86, 87. The adhesive joints 86, 87 of the microelectromechanical component form a conductive connection to the capsule structure 88 of the microelectromechanical component, which structure is provided with conductive coatings 89, 90. The capsule structure 88 of the microelectromechanical component is suitably designed to match the microelectromechanical component containing the microelectromechanical chip part 46 and the electronic circuit part 74.

A microelectromechanical component, manufactured by a method according to the invention, also possesses signal processing capability. By means of the invention, a microelectromechanical component solution is provided, in which electric functions have been integrated with the microelectromechanical component in a preferable manner, and which also is particularly applicable for small microelectromechanical motion sensor solutions, pressure sensor solutions, other sensor solutions, solutions for stabilization of frequency of oscillation, electrical signal filtering solutions, electrical signal switching solutions and electric impedance matching solutions.

The invention is particularly applicable for various microelectromechanical components, such as, for example, microelectromechanical gauges for use in measuring e.g. acceleration, angular acceleration, angular velocity, pressure or other physical quantities, for oscillators and frequency synthesizers used for generating and stabilizing an oscillation frequency, and for components, in which one desires to add to a function implemented by means of an electric circuit, such as a high frequency or intermediate frequency part of a radio device, microelectromechanical parts, such as resonators, filters, switches, or impedance matching elements, and for other microelectromechanical devices, in which one desires to combine microelectromechanical parts located in a sealed space with parts implemented by means of a microcircuit. By means of the invention, an improved method is provided for manufacturing a microelectromechanical component, which is particularly applicable for use in small microelectromechanical sensor solutions, solutions for stabilizing frequency of oscillation, electrical signal filtering solutions, electrical signal switching solutions, and electric impedance matching solutions.

In a microelectromechanical component manufactured by means of a method according to the invention, the mechanical and the electrical bonding of the microelectromechanical chip part and the electronic circuit part to each other can be implemented in a preferable manner by using a cover wafer of a specific kind, so that, in the manufacturing, either the microelectromechanical wafer or the circuit part wafer serves as substrate for installing the other chip (circuit part or microelectromechanical chip), and the connection between the parts remains protected from the external world.

In the method according to the invention, the electronic circuit parts can, for example, be installed one by one onto the surface of a microelectromechanical wafer provided with a cover. One can thus ensure, that only electronic circuit parts having passed testing are installed only in locations containing microelectromechanical chips having passed testing. In the method according to the invention, the microelectromechanical wafer is only diced after the installation stages and the final testing.

The invention claimed is:

1. A method for manufacturing a microelectromechanical component, in which method a microelectromechanical chip part is sealed by means of a cover part, which cover part contains lead-in structures for bringing electric connections through the cover part and conductive areas extending through the cover part, wherein at least one conductive area passes through a middle length-wise portion of the cover part, wherein, in the method, a first part is one of the following, and a second part is another one than the first part and one of the following:
    said microelectromechanical chip part sealed by means of the cover part, or
    an electronic circuit part, such that
    the first part is bonded to the second part by means of first bonding members, and that the second part is larger than the first part, and that, close to the first part, second bonding members are manufactured onto the surface of the second part, for external connections of the microelectromechanical component.

2. Method according to claim 1, wherein the cover part is mainly made of glass, such that, into the cover part, conductive areas extending through the glass element are manufactured out of silicon.

3. Method according to claim 2, wherein the cover part and/or the glass insulators are made of some other known dielectric material instead of glass.

4. Method according to claim 2, wherein the cover part and/or the conductive areas are made of some other known conductive material instead of silicon.

5. Method according to claim 1, wherein the cover part is mainly made of silicon, and into which cover part glass insulation is manufactured, such that, into the cover part, conductive areas extending through the glass insulation are manufactured out of silicon.

6. Method according to claim 1, wherein the cover part is mainly made of silicon, and into which cover part glass insulators are manufactured, such that the cover part is divided into strip-like conducting areas.

7. Method according to claim 1, wherein the cover part is mainly made of silicon, and into which cover part glass insulation is manufactured, such that the cover part is divided into insular conductive areas.

8. Method according to claim 1, wherein the formation of an electric connection between the conductive lead-in of the cover part and the microelectromechanical chip part is implemented by means of a direct bond.

9. Method according to claim 1, wherein the formation of an electric connection between the conductive lead-in of the cover part and the microelectromechanical chip part is implemented by means of metal layers located on the surface.

10. Method according to claim 1, wherein the formation of an electric connection between the conductive lead-in of the cover part and the microelectromechanical chip part is implemented by means of a soldering bump.

11. Method according to claim 1, wherein prior to bonding the cover part to the microelectromechanical chip part a redistribution layer is manufactured onto the surface of the cover part.

12. Method according to claim 11, wherein a conductive connection is created between the conductive areas of the cover part and first bonding members, by means of the redistribution layer.

13. Method according to claim 11, wherein a conductive connection is created between the first bonding members and the second bonding members, by means of the redistribution layer.

14. Method according to claim 11, wherein prior to manufacturing the redistribution layer, a dielectric layer is manufactured onto the surface of the cover part.

15. Method according to claim 11, wherein a protective layer is manufactured on top of the redistribution layer.

16. Method according to claim 1, wherein after bonding the cover part to the microelectromechanical chip part, a redistribution layer is manufactured onto the surface of the cover part.

17. Method according to claim 1, wherein the first bonding members are manufactured onto the surface of the circuit part.

18. Method according to claim 17, wherein the electronic circuit part is bonded by means of a flip-flop method to the surface of the cover part protecting the microelectromechanical chip part.

19. Method according to claim 17, wherein the electronic circuit part is smaller than the microelectromechanical chip part.

20. Method according to claim 17, wherein the narrow gap between the electronic circuit part and the cover part of the microelectromechanical chip part is filled with an underfill.

21. Method according to claim 17, wherein the second bonding members of the microelectromechanical component are implemented by means of wire connections.

22. Method according to claim 21, wherein a plastic cast capsule is cast over the microelectromechanical component.

23. Method according to claim 17, wherein the second bonding members of the microelectromechanical component are implemented by means of bump connectors.

24. Method according to claim 23, wherein the height of the bump connectors is at least equal to the total height of the electronic circuit part and the first bonding members.

25. Method according to claim 23, wherein the bump connectors are manufactured prior to the flip-flop bonding.

26. Method according to claim 23, wherein the bump connectors are manufactured interleaved with the manufacturing of the flip-flop bonding.

27. Method according to claim 23, wherein the microelectromechanical component is attached to the surface of a circuit board by means of the flip-flop method, such that the connection bumps line up with connection areas of the circuit board.

28. Method according to claim 17, wherein that the second bonding members of the microelectromechanical component are implemented by means of adhesive joints.

29. Method according to claim 28, wherein the second bonding members form a conductive connection to the capsule structure of the microelectromechanical component, which capsule structure is provided with conductive coatings.

30. Method according to claim 28, wherein the capsule structure of the microelectromechanical component is suitably designed to match the microelectromechanical component.

31. Method according to claim 17, wherein the second bonding members of the microelectromechanical component are implemented by means of direct soldering joints.

32. Method according to claim 1, wherein the first bonding members are manufactured on top of the redistribution layer of the cover part, into openings in the protective layer.

33. Method according to claim 1, wherein the first bonding members are manufactured onto the surface of the electronic circuit part.

34. Method according to claim 33, wherein the microelectromechanical chip part, by means of the flip-flop method, is bonded to the surface of the electronic circuit part, the cover part facing the surface of the electronic circuit part.

35. Method according to claim 33, wherein the microelectromechanical chip part is smaller than the electronic circuit part.

36. Method according to claim 33, wherein the narrow gap between the electronic circuit part and the cover part of the microelectromechanical chip part is filled with an underfill.

37. Method according to claim 33, wherein the second bonding members of the of the microelectromechanical component are implemented by means of wire connections.

38. Method according to claim 37, wherein a plastic cast capsule is cast over the microelectromechanical component.

39. Method according to claim 33, wherein the second bonding members of the microelectromechanical component are implemented by means of bump connectors.

40. Method according to claim 39, wherein the height of the bump connectors is at least equal to the total height of the microelectromechanical chip part and the first bonding member.

41. Method according to claim 39, wherein the bump connectors are manufactured prior to the flip-flop bonding.

42. Method according to claim 39, wherein the bump connectors are manufactured interleaved with the manufacturing of the flip-flop bonding.

43. Method according to claim 39, wherein the microelectromechanical component is attached to the surface of a circuit board by means of a flip-flop method, such that the connection bumps line up with connection areas of the circuit board.

44. Method according to claim 33, wherein that the second bonding members of the microelectromechanical component are implemented by means of adhesive joints.

45. Method according to claim 44, wherein the second bonding members form a conductive connection to the capsule structure of the microelectromechanical component, which capsule structure is provided with conductive coatings.

46. Method according to claim 44, wherein the capsule structure of the microelectromechanical component is suitably designed to match the microelectromechanical component.

47. Method according to claim 33, wherein the second bonding members of the microelectromechanical component are implemented by means of direct soldering joints.

48. Method according to claim 1, wherein the first bonding members are manufactured onto the redistribution layer of the cover part into openings in the protective layer.

49. Method according to claim 1, wherein the electronic circuit part of the microelectromechanical component possesses electrical signal processing capability.

50. Method according to claim 1, wherein a plate-like substrate comprising a set of second parts serves as a substrate for installing a first part.

51. Method according to claim 50, wherein a set of first parts are installed one by one onto the surface of the plate-like substrate comprising the set of second parts.

52. Method according to claim 51, wherein only first parts having passed testing are installed only onto the surface of second parts having passed testing.

53. Method according to claim 50, wherein the plate-like substrate comprising a second part is diced only after the installation phases.

54. Method according to claim 50, wherein the plate-like substrate comprising a second part is diced only after final testing.

55. A microelectromechanical component comprising:
a microelectromechanical chip part sealed by means of a cover part, which cover part contains lead-in structures for bringing electric connections through the cover part and conductive areas extending through the cover part, wherein at least one conductive area passes through a middle length-wise portion of the cover part, and
an electronic circuit part,
wherein a first part is one of the following, and a second part is another one than the first part and one of the following:
said microelectromechanical chip part sealed by means of the cover part, or
said electronic circuit part,
such that
the first part is bonded to the second part by means of first bonding members,
the second part is larger than the first part, and that, close to the first part, second bonding members are manufactured onto the surface of the second part, for external connections of the microelectromechanical component.

56. Microelectromechanical component according to claim 55, wherein the cover part is mainly made of glass, such that, into the cover part, the conductive areas extending through the glass element are manufactured out of silicon.

57. Microelectromechanical component according to claim 56, wherein the cover part is made of some other known dielectric material instead of glass.

58. Microelectromechanical component according to claim 55, wherein the cover part is mainly made of silicon, and into which cover part glass insulation is manufactured, such that, into the cover part, conductive areas extending through the glass insulation are manufactured out of silicon.

59. Microelectromechanical component according to claim 55, wherein the cover part is mainly made of silicon, and into which cover part glass insulators are manufactured, such that the cover part is divided into strip-like conducting areas.

60. Microelectromechanical component according to claim 55, wherein the cover part is mainly made of silicon, and into which cover part glass insulation is manufactured, such that the cover part is divided into insular conductive areas.

61. Microelectromechanical component according to claim 55, wherein the cover part is mainly made of some other known conductive material instead of silicon, such that, into the cover part, the conductive areas extending through the glass element made of some other known conductive material instead of silicon.

62. Microelectromechanical component according to claim 55, wherein the formation of the electric connection between the conductive lead-in of the cover part and the microelectromechanical chip part is implemented by means of a direct bond.

63. Microelectromechanical component according to claim 55, wherein the formation of the electric connection between the lead-in structures of the cover part and the microelectromechanical chip part is implemented by means of metal layers located on the surface of the cover part.

64. Microelectromechanical component according to claim 55, wherein the formation of the electric connection between the conductive lead-in of the cover part and the microelectromechanical chip part is implemented by means of a soldering bump.

65. Microelectromechanical component according to claim 55, wherein a redistribution layer is manufactured onto the surface of the cover part.

66. Microelectromechanical component according to claim 65, wherein a conductive connection is created between the conductive areas of the cover part and first bonding members, by means of the redistribution layer.

67. Microelectromechanical component according to claim 65, wherein a conductive connection is created between the first bonding members and the second bonding members, by means of the redistribution layer.

68. Microelectromechanical component according to claim 65, wherein prior to manufacturing the redistribution layer, a dielectric layer is manufactured onto the surface of the cover part.

69. Microelectromechanical component according to claim 65, wherein a protective layer is manufactured on top of the redistribution layer.

70. Microelectromechanical component according to claim 69, wherein the first bonding members are manufactured on top of the redistribution layer of the cover part into openings in the protective layer.

71. Microelectromechanical component according to claim 55, wherein the first bonding members are manufactured onto the surface of the electronic circuit part.

72. Microelectromechanical component according to claim 71, wherein the electronic circuit part is bonded to the surface of the cover part protecting the microelectromechanical chip part.

73. Microelectromechanical component according to claim 70, wherein the electronic circuit part is smaller than the microelectromechanical chip part.

74. Microelectromechanical component according to claim 70, wherein the narrow gap between the electronic circuit part and the cover part of the microelectromechanical chip part is filled with an underfill.

75. Microelectromechanical component according to claim 71, wherein the second bonding members of the microelectromechanical component are implemented by means of bump connectors.

76. Microelectromechanical component according to claim 75, wherein the height of the bump connectors is at least equal to the total height of the electronic circuit part and the first bonding members.

77. Microelectromechanical component according to claim 75, wherein the microelectromechanical component is attached to the surface of a circuit board, such that the connection bumps line up with connection areas of the circuit board.

78. Microelectromechanical component according to claim 71, wherein that the second bonding members of the microelectromechanical component are implemented by means of adhesive joints.

79. Microelectromechanical component according to claim 78, wherein the second bonding members form a conductive connection to the capsule structure of the microelectromechanical component, which capsule structure is provided with conductive coatings.

80. Microelectromechanical component according to claim 78, wherein the capsule structure of the microelectromechanical component is suitably designed to match the microelectromechanical component.

81. Microelectromechanical component according to claim 71, wherein the second bonding members of the microelectromechanical component are implemented by means of direct soldering joints.

82. Microelectromechanical component according to claim 55, wherein the microelectromechanical chip part is bonded to the surface of the electronic circuit part, the cover part facing the surface of the electronic circuit part.

83. Microelectromechanical component according to claim 55, wherein the microelectromechanical chip part is smaller than the electronic circuit part.

84. Microelectromechanical component according to claim 55, wherein the second bonding members of the microelectromechanical component are implemented by means of bump connectors.

85. Microelectromechanical component according to claim 84, wherein the height of the bump connectors is at least equal to the total height of the microelectromechanical chip part and the first bonding member.

86. Microelectromechanical component according to claim 84, wherein the microelectromechanical component is attached to the surface of a circuit board, such that the connection bumps line up with connection areas of the circuit board.

87. Microelectromechanical component according to claim 55, wherein that the second bonding members of the microelectromechanical component are implemented by means of adhesive joints.

88. Microelectromechanical component according to claim 87, wherein the second bonding members form a conductive connection to the capsule structure of the microelectromechanical component, which capsule structure is provided with conductive coatings.

89. Microelectromechanical component according to claim 87, wherein the capsule structure of the microelectromechanical component is suitably designed to match the microelectromechanical component.

90. Microelectromechanical component according to claim 55, wherein the second bonding members of the microelectromechanical component are implemented by means of direct soldering joints.

91. Microelectromechanical component according to claim 55, wherein the electronic circuit part of the microelectromechanical component possesses electrical signal processing capability.

92. A microelectromechanical component comprising:
   a microelectromechanical chip part sealed by means of a cover part, which cover part contains lead-in structures for bringing electric connections through the cover part, and
   an electronic circuit part,
wherein a first part is one of the following, and a second part is another one than the first part and one of the following:
   said microelectromechanical chip part sealed by means of the cover part, or
   said electronic circuit part,
such that
   the first part is bonded to the second part by means of first bonding members,
   the second part is larger than the first part, and that, close to the first part, second bonding members are manufactured onto the surface of the second part, for external connections of the microelectromechanical component,
wherein the first bonding members are manufactured onto the surface of the electronic circuit part, and
wherein the second bonding members of the microelectromechanical component are implemented by means of wire connections.

93. Microelectromechanical component according to claim 92, wherein a plastic cast capsule is cast over the microelectromechanical component.

94. A microelectromechanical acceleration sensor comprising:
   a microelectromechanical chip part sealed by means of a cover part, which cover part contains lead-in structures for bringing electric connections through the cover part and conductive areas extending through the cover part, wherein at least one conductive area passes through a middle length-wise portion of the cover part, and
   an electronic circuit part,
wherein a first part is one of the following, and a second part is another one than the first part and one of the following:
   said microelectromechanical chip part sealed by means of the cover part, or
   said electronic circuit part,
such that
   the first part is bonded to the second part by means of first bonding members,
   the second part is larger than the first part, and that, close to the first part, second bonding members are manufactured onto the surface of the second part, for external connections of the microelectromechanical acceleration sensor.

95. A microelectromechanical sensor of angular acceleration, comprising:
a microelectromechanical chip part sealed by means of a cover part, which cover part contains lead-in structures for bringing electric connections through the cover part and conductive areas extending through the cover part, wherein at least one conductive area passes through a middle length-wise portion of the cover part, and
an electronic circuit part,
wherein a first part is one of the following, and a second part is another one than the first part and one of the following:
said microelectromechanical chip part sealed by means of the cover part, or
said electronic circuit part,
such that
the first part is bonded to the second part by means of first bonding members,
the second part is larger than the first part, and that, close to the first part, second bonding members are manufactured onto the surface of the second part, for external connections of the microelectromechanical sensor of angular acceleration.

96. A microelectromechanical sensor of angular velocity, comprising:
a microelectromechanical chip part sealed by means of a cover part, which cover part contains lead-in structures for bringing electric connections through the cover part and conductive areas extending through the cover part, wherein at least one conductive area passes through a middle length-wise portion of the cover part, and
an electronic circuit part,
wherein a first part is one of the following, and a second part is another one than the first part and one of the following:
said microelectromechanical chip part sealed by means of the cover part, or
said electronic circuit part,
such that
the first part is bonded to the second part by means of first bonding members,
the second part is larger than the first part, and that, close to the first part, second bonding members are manufactured onto the surface of the second part, for external connections of the microelectromechanical sensor of angular velocity.

97. A microelectromechanical pressure sensor, comprising:
a microelectromechanical chip part sealed by means of a cover part, which cover part contains lead-in structures for bringing electric connections through the cover part and conductive areas extending through the cover part, wherein at least one conductive area passes through a middle length-wise portion of the cover part, and
an electronic circuit part,
wherein a first part is one of the following, and a second part is another one than the first part and one of the following:
said microelectromechanical chip part sealed by means of the cover part, or
said electronic circuit part,
such that
the first part is bonded to the second part by means of first bonding members,
the second part is larger than the first part, and that, close to the first part, second bonding members are manufactured onto the surface of the second part, for external connections of the microelectromechanical pressure sensor.

98. A microelectromechanical stabilizer of frequency of oscillation, comprising:
a microelectromechanical chip part sealed by means of a cover part, which cover part contains lead-in structures for bringing electric connections through the cover part and conductive areas extending through the cover part, wherein at least one conductive area passes through a middle length-wise portion of the cover part, and
an electronic circuit part,
wherein a first part is one of the following, and a second part is another one than the first part and one of the following:
said microelectromechanical chip part sealed by means of the cover part, or
said electronic circuit part,
such that
the first part is bonded to the second part by means of first bonding members,
the second part is larger than the first part, and that, close to the first part, second bonding members are manufactured onto the surface of the second part, for external connections of the microelectromechanical stabilizer of frequency of oscillation.

99. A microelectromechanical filter of an electrical signal, comprising:
a microelectromechanical chip part sealed by means of a cover part, which cover part contains lead-in structures for bringing electric connections through the cover part and conductive areas extending through the cover part, wherein at least one conductive area passes through a middle length-wise portion of the cover part, and
an electronic circuit part,
wherein a first part is one of the following, and a second part is another one than the first part and one of the following:
said microelectromechanical chip part sealed by means of the cover part, or
said electronic circuit part,
such that
the first part is bonded to the second part by means of first bonding members,
the second part is larger than the first part, and that, close to the first part, second bonding members are manufactured onto the surface of the second part, for external connections of the microelectromechanical filter of an electrical signal.

100. A microelectromechanical switching component for an electrical signal, comprising:
a microelectromechanical chip part sealed by means of a cover part, which cover part contains lead-in structures for bringing electric connections through the cover part, and
an electronic circuit part and conductive areas extending through the cover part, wherein at least one conductive area passes through a middle length-wise portion of the cover part,
wherein a first part is one of the following, and a second part is another one than the first
part and one of the following:
said microelectromechanical chip part sealed by means of the cover part, or
said electronic circuit part,
such that
the first part is bonded to the second part by means of first bonding members, the second part is larger than the first part, and that, close to the first part, second bonding members are manufactured onto the surface of the second part, for external connections of the microelectromechanical switching component for an electrical signal.

101. A microelectromechanical electric impedance matching device, comprising:
   a microelectromechanical chip part sealed by means of a cover part, which cover part contains lead-in structures for bringing electric connections through the cover part and conductive areas extending through the cover part, wherein at least one conductive area passes through a middle length-wise portion of the cover part, and
   an electronic circuit part,
wherein a first part is one of the following, and a second part is another one than the first part and one of the following:
   said microelectromechanical chip part sealed by means of the cover part, or
   said electronic circuit part,
such that
   the first part is bonded to the second part by means of first bonding members,
   the second part is larger than the first part, and that, close to the first part, second bonding members are manufactured onto the surface of the second part, for external connections of the microelectromechanical electric impedance matching device.

* * * * *

UNITED STATES PATENT AND TRADEMARK OFFICE
CERTIFICATE OF CORRECTION

| | |
|---|---|
| PATENT NO. | : 7,982,291 B2 |
| APPLICATION NO. | : 11/430035 |
| DATED | : July 19, 2011 |
| INVENTOR(S) | : Heikki Kuisma |

It is certified that error appears in the above-identified patent and that said Letters Patent is hereby corrected as shown below:

Column 5:

Line 24, change "flip-flop" to -- flip-chip --
Line 39, change "flip-flop" to -- flip-chip --
Line 40, change "flip-flop" to -- flip-chip --
Line 42, change "flip-flop" to -- flip-chip --
Line 63, change "flip-flop" to -- flip-chip --

Column 6:

Line 12, change "flip-flop" to -- flip-chip --
Line 13 & 14, change "flip-flop" to -- flip-chip --
Line 16, change "flip-flop" to -- flip-chip --

Column 15:

Line 52, change "flip-flop" to -- flip-chip --

Column 16:

Line 19, change "flip-flop" to -- flip-chip --
Line 30, change "flip-flop" to -- flip-chip --
Line 47, change "flip-flop" to -- flip-chip --
Line 52, change "flip-flop" to -- flip-chip --

Signed and Sealed this
Eighth Day of January, 2013

David J. Kappos
*Director of the United States Patent and Trademark Office*

CERTIFICATE OF CORRECTION (continued)
U.S. Pat. No. 7,982,291 B2

Column 17:

Line 5, change "flip-flop" to -- flip-chip --
Line 36, change "flip-flop" to -- flip-chip --
Line 52, change "flip-flop" to -- flip-chip --
Line 53, change "flip-flop" to -- flip-chip --
Line 54, change "flip-flop" to -- flip-chip --

Column 18:

Line 1, change "flip-flop" to -- flip-chip --
Line 9, change "flip-flop" to -- flip-chip --
Line 12, change "flip-flop" to -- flip-chip --
Line 36, change "flip-flop" to -- flip-chip --
Line 51, change "flip-flop" to -- flip-chip --
Line 64, change "flip-flop" to -- flip-chip --

Column 19:

Line 20, change "flip-flop" to -- flip-chip --
Line 32, change "flip-flop" to -- flip-chip --
Line 34, change "flip-flop" to -- flip-chip --
Line 35, change "flip-flop" to -- flip-chip --
Line 46, change "flip-flop" to -- flip-chip --

Column 21:

Line 65, change "flip-flop" to -- flip-chip --

Column 22:

Line 20, change "flip-flop" to -- flip-chip --
Line 23, change "flip-flop" to -- flip-chip --
Line 26, change "flip-flop" to -- flip-chip --
Line 51, change "flip-flop" to -- flip-chip --

Column 23:

Line 6, change "flip-flop" to -- flip-chip --
Line 9, change "flip-flop" to -- flip-chip --
Line 12, change "flip-flop" to -- flip-chip --